(12) United States Patent
Ugawa et al.

(10) Patent No.: US 7,816,679 B2
(45) Date of Patent: Oct. 19, 2010

(54) ORGANIC COMPOUND CRYSTAL AND FIELD-EFFECT TRANSISTOR

(75) Inventors: Akito Ugawa, Kanagawa (JP); Yousuke Ohta, Kanagawa (JP); Toshiyuki Kunikiyo, Kanagawa (JP); Masayuki Murakami, Kanagawa (JP)

(73) Assignee: Sony Corporation, Tokyo (JP)

( * ) Notice: Subject to any disclaimer, the term of this patent is extended or adjusted under 35 U.S.C. 154(b) by 77 days.

(21) Appl. No.: 12/182,203

(22) Filed: Jul. 30, 2008

(65) Prior Publication Data

US 2009/0072227 A1    Mar. 19, 2009

Related U.S. Application Data

(62) Division of application No. 11/152,709, filed on Jun. 14, 2005, now Pat. No. 7,425,722.

(30) Foreign Application Priority Data

Jun. 16, 2004    (JP) .............................. 2004-177829

(51) Int. Cl.
*H01L 51/30* (2006.01)
*C07D 339/00* (2006.01)

(52) U.S. Cl. ............ 257/40; 257/E51.024; 257/E51.05; 549/31

(58) Field of Classification Search ............. 257/40, 257/E51.001, E51.024–E51.026, E51.029–E51.03, 257/E51.047–E51.05, E51.052; 549/30–31, 549/35–36

See application file for complete search history.

(56) References Cited

U.S. PATENT DOCUMENTS

| | | | |
|---|---|---|---|
| 3,627,655 A | 12/1971 | Perez-Albuerne | |
| 3,629,158 A | 12/1971 | Perez-Albuerne | |
| 3,634,336 A | 1/1972 | Perez-Albuerne | |
| 3,754,986 A | 8/1973 | Perez-Albuerne | |
| 6,998,068 B2 | 2/2006 | Gerlach | |
| 2003/0088112 A1 | 5/2003 | Holmes | |
| 2004/0104386 A1 | 6/2004 | Wu et al. | |
| 2004/0247814 A1 | 12/2004 | Sirringhaus et al. | |
| 2005/0119440 A1 | 6/2005 | Marks et al. | |
| 2006/0231827 A1 | 10/2006 | Hanato et al. | |

FOREIGN PATENT DOCUMENTS

WO    WO 2005096417 A1 * 10/2005

OTHER PUBLICATIONS

Ayyangar, N.R., et al. "Heterocyclic Quinonoid Chromophoric Systems: Part 1—Trithiapentalenes & Analogues as Dyes." Ind. J. Chem., vol. 16B (Aug. 1978): pp. 673-677.*

(Continued)

*Primary Examiner*—Matthew W Such
(74) *Attorney, Agent, or Firm*—Frommer Lawrence & Haug LLP; William S. Frommer

(57) ABSTRACT

A field-effect transistor includes a channel-forming region composed of an organic compound crystal including π-electron conjugated molecules each containing chalcogen atoms as a constituent, wherein the distance between chalcogen atoms of adjacent π-electron conjugated molecules is short, and the organic compound crystal has a periodic structure in which π-electron conjugated molecules are two-dimensionally or three-dimensionally linked together.

1 Claim, 17 Drawing Sheets

OTHER PUBLICATIONS

Xue, L.J., et al. "Anthracene Based Organodisulfide Positive Active Materials for Lithium Secondary Battery." Electrochem. Comm., vol. 5 (2003): pp. 903-906.*

Davidson, S., et al. "The Dithiol Series. Part 7. Synthesis of Compounds Containing Condensed Ring Systems Related to 1,6,6a-Trithiapentalene." J. Chem. Research (S) (1980): pp. 221.*

Takimiya, K., et al. "Syntheses, Structures and Properties of Phenanthro[1, 10-cd:8,9-c'd']bis[1,2]-dithiole and -diselenole and Their Methyl and Methylthio Derivatives as novel Electron Donors." J. Mater. Chem. vol. 5, No. 10 (1995): pp. 1539-1547.

Endres, H., et al. "Structure of Anthra[9,1-cd:5-c'd']bis[1,2]diselenole (TSA) and of its Partially Oxidized, Metallic Polyiodide TSA 11.2." Acta Cryst. vol. B38 (1982): pp. 2855-2860.

Lyubovskaya, R.N. "Organic Materials and Superconductors Based on Tetrathiofulvalene Derivatives." Rus. Chem. Rev., vol. 52, No. 8 (1983): pp. 736-750.

Takimiya, K., et al. "Phenanthro[1, 10-cd:8,9-c'd']bis[1,2]-dithiole and -diselenole as Novel Electron Donors." J. Chem.Soc., Chem. Commun. (1992): pp. 278-280.

* cited by examiner

ORGANIC COMPOUND CRYSTAL AND FIELD-EFFECT TRANSISTOR

This is a division of application Ser. No. 11/152,709, filed Jun. 14, 2005 now U.S. Pat. No. 7,425,722, which is entitled to the priority filing date of Japanese application 2004-177829 filed on Jun. 16, 2004, the entirety all of which are incorporated herein by reference.

CROSS REFERENCES TO RELATED APPLICATIONS

The present invention contains subject matter related to Japanese Patent Application JP 2004-177829 filed in the Japanese Patent Office on Jun. 16, 2004, the entire contents of which are incorporated herein by reference.

BACKGROUND OF THE INVENTION

1. Field of the Invention

The present invention relates to organic compound crystals and field-effect transistors.

2. Description of the Related Art

During recent years, research has been actively carried out on organic transistors, and the performance of the organic transistors has almost reached a practical level. Currently, it has been reported that 2,3,6,7-dibenzanthracene (also referred to as "pentacene"), which is a condensed aromatic compound, shows the best performance as the material for a channel-forming region in an organic transistor (for example, refer to H. Klauk et al., J. Appl. Phys. 92, 5259 (2002)).

With respect to the electron state of pentacene, band analysis is performed using ab initio calculation (for example, refer to M. L. Tiago et al., Phys. Rev. B67, 115212 (2003)). The pentacene molecules in a crystal do not have a stack structure as shown in FIG. 22, but have a herringbone structure as shown in FIG. 23. Two-dimensional layers each having the herringbone structure are stacked (for example, refer to R. B. Champbell et al., Acta Cryst. 14, 705 (1961); and D. Homes et al., J. Eur. Chem. 5, 3399 (1999)). Band analysis results support that a two-dimensional conduction path is formed in the two-dimensional layer.

In a one-dimensional conduction band which is often observed when molecules have a stack structure, the conduction path is anisotropic (one-dimensional). Therefore, such molecules are disadvantageous in the formation of a channel-forming region in a field-effect transistor. Moreover, because of the one-dimensional conduction band, interactions among charge carriers (e.g., Coulomb repulsive force among the charge carriers) are large, and thus movement of charge carriers is inhibited.

Consequently, the two-dimensional conduction band in pentacene is desirable as the electron structure for constituting a channel-forming region of a field-effect transistor. Since pentacene is a p-type substance, holes are accumulated in the HOMO band, contributing to conduction.

One of the parameters which represent the movement of charge carriers is mobility. The mobility is defined as the drift velocity of charge carriers per unit electric field. Higher mobility enables higher speed movement of charge carriers, and as a result, high speed performance of the field-effect transistor is enabled. However, it is difficult to directly evaluate the mobility by calculation. A parameter alternative to the mobility is the effective mass of the band. The degree of ease of movement of charge carriers in the band is expressed based on the effective mass of the band. Charged carriers present in the band having the smaller effective mass have higher mobility. In order to decrease the effective mass, the bandwidth must be large, and furthermore, interactions among molecules must be large. For the reasons described above, in an attempt to form a higher performance channel-forming region using an organic material, it is necessary to design molecules capable of exhibiting strong interactions among each other two-dimensionally or three-dimensionally in the crystalline state.

Interactions among molecules are carried out by $\pi$-electron systems extending perpendicular to the $\sigma$-bonds constituting the backbones of molecules. Furthermore, to enable free movement of charge carriers in a molecule, the $\pi$-electron systems must be conjugated and extend intermolecularly.

SUMMARY OF THE INVENTION

The backbone of an acene hydrocarbon, such as pentacene, is composed of a $\pi$-electron system in which many benzene rings are condensed, and charge carriers can move intermolecularly. However, the acene hydrocarbon has a structure in which the outer periphery of the molecule is covered with hydrogen atoms, and thus intermolecular conduction paths are not easily formed. Therefore, in order to produce a two-dimensional conduction band, as described above, a structure in which two-dimensional layers having the herringbone structure are stacked is required.

Furthermore, since the extent of the $\pi$-electron orbital which is a carbon $(2s)(2p)^2$ hybrid orbital is small, it is difficult to produce strong interactions.

Therefore, as long as the acene hydrocarbon is used, in present circumstances, pentacene is believed to be the best material for forming a channel-forming region of a field-effect transistor. However, as the material for forming the channel-forming region of the field-effect transistor, there is strong demand for materials having characteristics that are superior to pentacene, e.g., a material having high mobility.

As disclosed in Japanese Unexamined Patent Application Publication No. 2000-66233, a liquid crystal display device provided with field-effect transistors is known, the field-effect transistors each including a semiconductor layer including a compound represented by the general formula below (wherein $X_1$, $X_2$, $X_3$, and $X_4$ each represent S, Se, or Te; and $R_1$, $R_2$, $R_3$, and $R_4$ each represent hydrogen, or a substituent, such as alkyl or halogen).

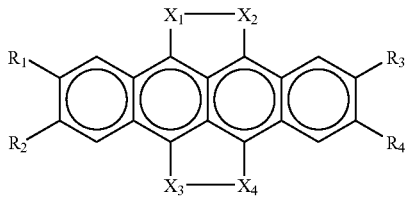

However, this patent application publication does not include a description on how the semiconductor layer is constructed using the compound represented by the general formula described above.

It is desirable to provide a material (organic compound crystal) having superior characteristics (e.g., high mobility), for example, used for forming a channel-forming region of a field-effect transistor, and a field-effect transistor including such a material (organic compound crystal).

An organic compound crystal according to an embodiment of the present invention is composed of $\pi$-electron conjugated molecules each containing chalcogen atoms as a constituent, wherein the distance between chalcogen atoms of adjacent π-electron conjugated molecules is short, and the organic compound crystal has a periodic structure in which π-electron conjugated molecules are two-dimensionally or three-dimensionally linked together (namely, a two-dimensional or three-dimensional network structure is formed).

A field-effect transistor according to a first embodiment of the present invention includes a channel-forming region composed of an organic compound crystal including π-electron conjugated molecules each containing chalcogen atoms as a constituent, wherein the distance between chalcogen atoms of adjacent π-electron conjugated molecules is short, and the organic compound crystal has a periodic structure in which π-electron conjugated molecules are two-dimensionally or three-dimensionally linked together (namely, a two-dimensional or three-dimensional network structure is formed).

In the organic compound crystal according to the embodiment of the present invention or the field-effect transistor according to the first embodiment of the present invention, preferably, among chalcogen atoms ($X_i$) in a π-electron conjugated molecule and chalcogen atoms ($X_j$) in its adjacent π-electron conjugated molecule, the distance $R_{ij}$ between at least one pair of chalcogen atoms ($X_i$, $X_j$) satisfies the relationship $R_{ij} \leq (r_1+r_2) \times 1.1$, wherein $r_1$ is the van der Waals' radius of the chalcogen atom in the π-electron conjugated molecule, and $r_2$ is the van der Waals' radius of the chalcogen atom in its adjacent π-electron conjugated molecule.

Alternatively, in the organic compound crystal according to the embodiment of the present invention or the field-effect transistor according to the first embodiment of the present invention, preferably, the chalcogen atoms are contained in a π-electron conjugated system (or any one of being conjugated with the π-electron conjugated system, participating in the π-electron conjugated system, and being taken up by the π-electron conjugated system).

Alternatively, in the organic compound crystal according to the embodiment of the present invention or the field-effect transistor according to the first embodiment of the present invention, preferably, in each π-electron conjugated molecule, the chalcogen atoms are placed on the outer periphery of the molecule.

Alternatively, in the organic compound crystal according to the embodiment of the present invention or the field-effect transistor according to the first embodiment of the present invention, preferably, the ratio of the total mass of chalcogen atoms to the molecular weight of the π-electron conjugated molecule is, for example, 40% or more. The reason for this is that as the number of chalcogen atoms contained in one π-electron conjugated molecule increases, interactions among π-electron conjugated molecules are likely to increase.

In general, the term "chalcogen atom" refers to an oxygen (O), sulfur (S), selenium (Se), tellurium (Te), or polonium (Po) atom. In this specification, the term "chalcogen atom" refers to an atom selected from the group consisting of oxygen (O), sulfur (S), selenium (Se), and tellurium (Te) atoms.

In field-effect transistors according to second to seventh embodiments of the present invention, as shown in general formulae (1) to (6), the π-electron conjugated molecule has a backbone in which chalcogen atoms are combined with a polyacene to constitute the outer periphery. Furthermore, in field-effect transistors according to eighth to eleventh embodiments of the present invention, as shown in general or structural formulae (7) to (10), the π-electron conjugated molecule has a structure which does not contain hydrogen atoms as a constituent. Furthermore, in a field-effect transistor according to a twelfth embodiment of the present invention, the π-electron conjugated molecule has a tetrathiafulvalene (TTF) backbone, as a matrix, which is a strong electron donor.

A field-effect transistor according to a second embodiment of the present invention includes a channel-forming region composed of π-electron conjugated molecules each represented by general formula (1):

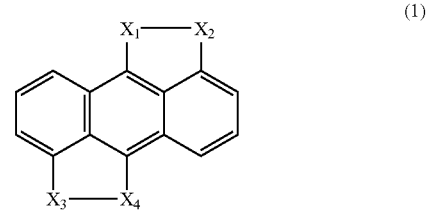

(1)

wherein $X_1$, $X_2$, $X_3$, and $X_4$ each represent any one of an oxygen atom, a sulfur atom, a selenium atom, and a tellurium atom.

Alternatively, a field-effect transistor according to a third embodiment of the present invention includes a channel-forming region composed of π-electron conjugated molecules each represented by general formula (2):

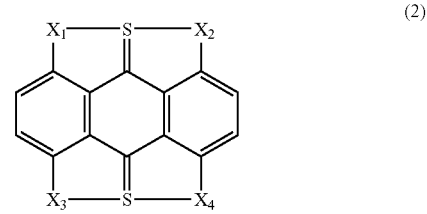

(2)

wherein $X_1$, $X_2$, $X_3$, and $X_4$ each represent any one of an oxygen atom, a sulfur atom, a selenium atom, and a tellurium atom.

Alternatively, a field-effect transistor according to a fourth embodiment of the present invention includes a channel-forming region composed of π-electron conjugated molecules each represented by general formula (3):

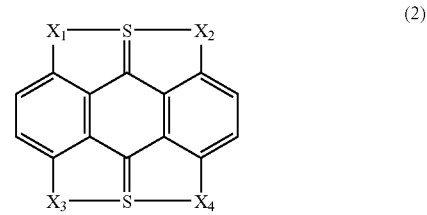

(2)

wherein $X_1$, $X_2$, $X_3$, and $X_4$ each represent any one of an oxygen atom, a sulfur atom, a selenium atom, and a tellurium atom.

Alternatively, a field-effect transistor according to a fifth embodiment of the present invention includes a channel-forming composed of π-electron conjugated molecules each represented by general formula (4):

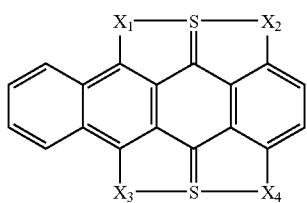

(4)

wherein $X_1$, $X_2$, $X_3$, and $X_4$ each represent any one of an oxygen atom, a sulfur atom, a selenium atom, and a tellurium atom.

Alternatively, a field-effect transistor according to a sixth embodiment of the present invention includes a channel-forming region composed of π-electron conjugated molecules each represented by general formula (5):

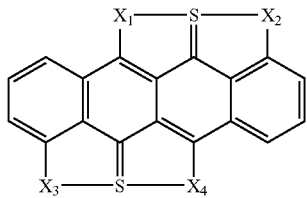

(5)

wherein $X_1$, $X_2$, $X_3$, and $X_4$ each represent any one of an oxygen atom, a sulfur atom, a selenium atom, and a tellurium atom.

Alternatively, a field-effect transistor according to a seventh embodiment of the present invention includes a channel-forming region composed of α-electron conjugated molecules each represented by general formula (6):

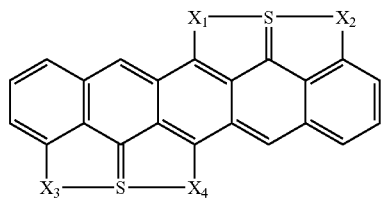

(6)

wherein $X_1$, $X_2$, $X_3$, and $X_4$ each represent any one of an oxygen atom, a sulfur atom, a selenium atom, and a tellurium atom.

Alternatively, a field-effect transistor according to an eighth embodiment of the present invention includes a channel-forming region composed of π-electron conjugated molecules each represented by general formula (7):

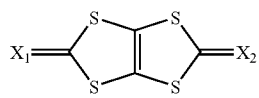

(7)

wherein $X_1$ and $X_2$ each represent either an oxygen atom or a sulfur atom.

Alternatively, a field-effect transistor according to a ninth embodiment of the present invention includes a channel-forming region composed of π-electron conjugated molecules each represented by general formula (8):

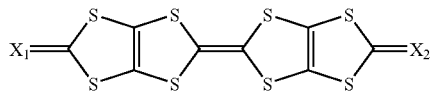

(8)

wherein $X_1$ and $X_2$ each represent either an oxygen atom or a sulfur atom.

Alternatively, a field-effect transistor according to a tenth embodiment of the present invention includes a channel-forming region composed of π-electron conjugated molecules each represented by structural formula (9) below.

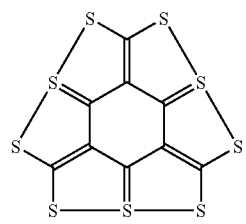

(9)

Alternatively, a field-effect transistor according to an eleventh embodiment of the present invention includes a channel-forming region composed of π-electron conjugated molecules each represented by structural formula (10) below.

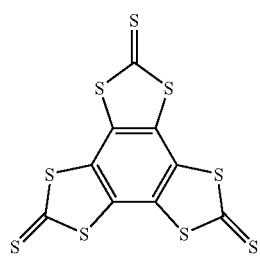

(10)

Alternatively, a field-effect transistor according to a twelfth embodiment of the present invention includes a channel-forming region composed of π-electron conjugated molecules each represented by general formula (11):

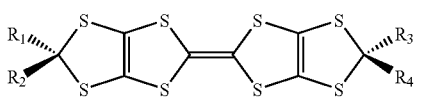

(11)

wherein $R_1$, $R_2$, $R_3$, and $R_4$ each represent either a hydrogen atom or an alkyl group having 10 or less carbon atoms. The term "alkyl group" includes a saturated or unsaturated alkyl group, and the structure having at least one alkyl chain, up to four alkyl chains, at molecular end(s) can enhance solubility.

The field-effect transistors according to the first to twelfth embodiments of the present invention, for example, may have any one of the four structures described below. In the field-effect transistors according to the first to twelfth embodiments, an extension of the channel-forming region may be hereinafter referred to as a channel-forming region extension.

Namely, a field-effect transistor having a first structure is a bottom gate/top contact type and includes (A) a gate electrode disposed on a support, (B) a gate-insulating layer disposed on the gate electrode, (C) a channel-forming region and a channel-forming region extension disposed on the gate-insulating layer, and (D) source/drain electrodes disposed on the channel-forming region extension.

A field-effect transistor having a second structure is a top gate/top contact type and includes (A) a channel-forming region and a channel-forming region extension disposed on a support, (B) source/drain electrodes disposed on the channel-forming region extension, (C) a gate-insulating layer disposed on the source/drain electrodes and the channel-forming region, and (D) a gate electrode disposed on the gate-insulating layer.

A field-effect transistor having a third structure is a bottom gate/bottom contact type and includes (A) a gate electrode disposed on a support, (B) a gate-insulating layer disposed on the gate electrode, (C) source/drain electrodes disposed on the gate-insulating layer, and (D) a channel-forming region disposed on the gate-insulating layer.

A field-effect transistor having a fourth structure is a top gate/bottom contact type and includes (A) source/drain electrodes disposed on a support, (B) a channel-forming region disposed on the support and a channel-forming region extension disposed on the source/drain electrodes, (C) a gate-insulating layer disposed on the channel-forming region and the channel-forming region extension, and (D) a gate electrode disposed on the gate-insulating layer.

Examples of the method for forming the channel-forming region composed of the organic compound crystals in the field-effect transistor according to the first embodiment of the present invention and the method for forming the channel-forming region composed of π-electron conjugated molecules each represented by any one of general or structural formulae (1) to (11) in the field-effect transistor according to any one of the second to twelfth embodiments of the present invention include physical vapor deposition (PVD), such as vacuum deposition and sputtering; various types of chemical vapor deposition (CVD); spin coating methods; printing methods, such as screen printing and ink-jet printing; various types of coating methods, such as air-doctor coating, blade coating, rod coating, knife coating, squeeze coating, reverse roll coating, transfer roll coating, gravure coating, kiss coating, cast coating, spray coating, slit orifice coating, and calender coating; and spraying methods.

In the field-effect transistor according to any one of the embodiments of the present invention, examples of the material for the gate-insulating layer include inorganic insulating materials, such as $SiO_2$, SiN, spin on glass (SOG), $Al_2O_3$, and high dielectric metal oxide films; and organic insulating materials, such as polymethyl methacrylate (PMMA), polyvinyl phenol (PVP), polyethylene terephthalate (PET), polyoxymethylene (POM), polyvinyl chloride, polyvinylidene fluoride, polysulfone, polycarbonate (PC), and polyimide. These materials may be used in combination. The gate-insulating layer may be formed, for example, by any method selected from the group consisting of PVD, such as vacuum deposition and sputtering: various types of CVD; spin coating methods; printing methods, such as screen printing and ink-jet printing; various types of coating methods described above; dipping methods; casting methods; and spraying methods.

Alternatively, although depending on the structure of the field-effect transistor, the gate-insulating layer may be formed by oxidation of the surface of the gate electrode. As the method for oxidizing the surface of the gate electrode, although depending on the material constituting the gate electrode, for example, a thermal oxidation method, an oxidation method using $O_2$ plasma, or an anodic oxidation method may be mentioned. Furthermore, for example, when the gate electrode is composed of gold (Au), a gate-insulating layer may be formed in a self-assembled manner on the surface of the gate electrode by coating the surface of the gate electrode with insulating molecules having functional groups capable of forming chemical bonds with the gate electrode, such as linear hydrocarbon molecules with one end being modified with a mercapto group, using a dipping method or the like.

Furthermore, in the field-effect transistor according to any one of the embodiments of the present invention, examples of the materials for the gate electrode, the source/drain electrodes, and various types of lines include metals, such as platinum (Pt), gold (Au), palladium (Pd), chromium (Cr), nickel (Ni), molybdenum (Mo), niobium (Nb), neodymium (Nd), aluminum (Al), silver (Ag), tantalum (Ta), tungsten (W), copper (Cu), rubidium (Rb), rhodium (Rh), titanium (Ti), indium (In), and tin (Sn), alloys containing these metal elements, conductive particles composed of these metals, conductive particles composed of alloys containing these metals, polysilicon, amorphous silicon, tin oxide, indium oxide, and indium tin oxide (ITO). Layers containing these elements may be stacked for form a multi-layered structure. Furthermore, as the material for the gate electrode and the source/drain electrodes, an organic material, such as poly(3,4-ethylenedioxythiophene/polystyrene sulfonic acid [PEDOT/PSS], may be mentioned.

Examples of the method for forming the source/drain electrodes and the gate electrode include, although depending on the materials constituting them, PVD, such as vacuum deposition and sputtering; various types of CVD including MOCVD; spin coating methods; printing methods, such as screen printing and ink-jet printing using various types of conductive paste and various types of conductive polymer solutions; various types of coating methods described above; lift-off methods; shadow-mask methods; plating methods, such as electrolytic plating, electroless plating, or a combination of both; and spraying methods. Furthermore, as required, these methods may be combined with patterning techniques. Additionally, examples of PVD include (a) various types of vacuum deposition methods, such as electron beam heating, resistance heating, and flash vapor deposition; (b) plasma deposition methods; (c) various types of sputtering methods, such as diode sputtering, DC sputtering, DC magnetron sputtering, RF sputtering, magnetron sputtering, ion beam sputtering, and bias sputtering; and (d) various types of ion plating methods, such as direct current (DC) methods, RF methods, multi-cathode methods, activated reactive ion plating methods, electric field deposition, RF ion plating, and reactive ion plating.

In the field-effect transistor according to any one of the embodiments of the present invention, examples of the support include various types of glass substrates, various types of glass substrates provided with insulating layers on the surfaces thereof, quartz substrates, quartz substrates provided with insulating layers on the surfaces thereof, and silicon substrates provided with insulating layers on the surfaces thereof. Other examples of the support include plastic films, plastic sheets, and plastic substrates composed of polymeric materials, such as polyether sulfone (PES), polyimide, polycarbonate (PC), and polyethylene terephthalate (PET). By using a support composed of any one of such flexible polymeric materials, for example, the resulting field-effect transistor can be built in or integrated into a display device or an electronic apparatus having curved surfaces.

When the field-effect transistors according to the embodiments of the present invention are applied to or used for display devices or various types of electronic apparatuses, monolithic integrated circuits in which many field-effect transistors are integrated on supports may be fabricated, or the individual field-effect transistors may be separated by cutting to produce discrete components. Alternatively, the field-effect transistors may be sealed with resins.

In the present invention, by introducing many chalcogen atoms having large orbitals into π-electron conjugated molecules, the interactions among π-electron conjugated molecules are strengthened, for example, compared with acene hydrocarbons composed of carbon and hydrogen atoms. Namely, because of a superposition of orbitals of chalcogen atoms, the bandwidth is increased and anisotropy is reduced. Thereby, the charge carriers transporting ability in the channel-forming region in the field-effect transistor can be improved. Furthermore, if chalcogen atoms are placed so as to participate in the π-electron conjugated systems of the molecular backbones and are placed as much as possible on the outer peripheries of the molecules, that is, placed on the outer peripheries of the π-electron conjugated molecules, intermolecular interactions among π-electron conjugated molecules in a direction parallel to the molecular plane can also be produced. Consequently, two-dimensional or three-dimensional conduction paths can be formed and the conduction bandwidth can be increased. As a result, the effective mass of charge carriers in the organic compound crystal is decreased, and the organic compound crystal can be used as a material constituting an organic active element having high mobility. That is, by using the organic compound crystal into which chalcogen atoms are introduced as the material constituting the channel-forming region, it is possible to greatly improve the performance of the organic transistor as the field-effect transistor.

DESCRIPTION OF THE PREFERRED EMBODIMENTS

The present invention will be described based on examples with reference to the drawings.

Example 1

Example 1 relates to an organic compound crystal according to the embodiment of the present invention, a field-effect transistor (hereinafter referred to as "FET") according to the first embodiment of the present invention, and a FET according to the fourth embodiment of the present invention.

The organic compound crystal in Example 1 is composed of hexathiopentacene (HTP) corresponding to a π-electron conjugated molecule represented by structural formula (3') below which contains chalcogen atoms, i.e., sulfur (S), as a constituent.

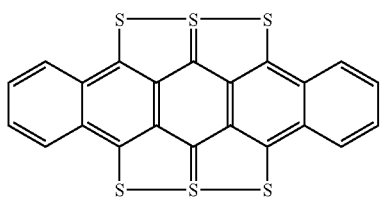

(3')

Figure 3A:
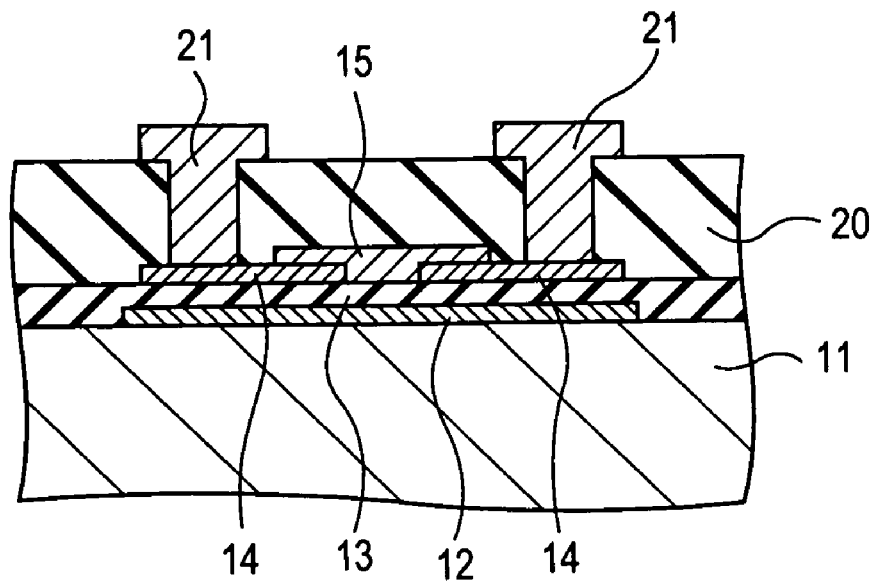
FIG. 3A is a schematic partial sectional view showing bottom gate/bottom contact type field-effect transistor in Example 1.

The FET in Example 1 includes a channel-forming region composed of organic compound crystals as shown FIG. 3A which is a schematic partial sectional view. Specifically, the FET in Example 1 has the third structure, i.e., the FET is a bottom gate/bottom contact type, and includes (A) a gate electrode 12 disposed on a support 11, (B) a gate-insulating layer 13 disposed on the gate electrode 12, (C) source/drain electrodes 14 disposed on the gate-insulating layer 13, and (D) a channel-forming region 15 disposed on the gate-insulating layer 13.

Furthermore, an insulating layer 20 is disposed over the entire surface, and lines 21 connected to the source/drain electrodes 14 are disposed on the insulating layer 20.

Here, the organic compound crystals constituting the channel-forming region 15 are composed of hexathiopentacene (HTP) corresponding to the π-electron conjugated molecule represented by structural formula (3') above which contains chalcogen atoms, i.e., sulfur (S), as a constituent.

In Example 1, the distance between chalcogen atoms (sulfur, S) of a π-electron conjugated molecule (HTP) and chalcogen atoms (sulfur, S) of its adjacent π-electron conjugated molecule (HTP) is short. That is, chalcogen atoms of a π-electron conjugated molecule and chalcogen atoms of its adjacent π-electron conjugated molecule are linked to each other. In other words, chalcogen atoms of a π-electron conjugated molecule and the chalcogen atoms of its adjacent π-electron conjugated molecule have interactions among each other. The organic compound crystal has a periodic structure in which π-electron conjugated molecules are two-dimensionally linked together (namely, a two-dimensional network structure is formed).

Specifically, sulfur (S), which is the chalcogen atom in Example 1, has a van der Waals' radius $(r_1=r_2)$ of 1.80 Å. Among chalcogen atoms $(X_i)$ in a π-electron conjugated molecule and chalcogen atoms $(X_j)$ in its adjacent π-electron conjugated molecule, the distance $R_{ij}$ between at least one pair of chalcogen atoms $(X_i, X_j)$ satisfies the relationship $R_{ij} \leq (r_1+r_2) \times 1.1 = 3.96$ Å. The $R_{ij}$ value is, for example, 3.34 Å, 3.38 Å, or 3.56 Å. Furthermore, sulfur (S), i.e., the chalcogen atom, is contained in the π-electron conjugated system, conjugated with the π-electron conjugated system, participating in the π-electron conjugated system, or taken up by the π-electron conjugated system. Furthermore, in each π-electron conjugated molecule, sulfur (S), i.e., the chalcogen atom, is placed on the outer periphery of the π-electron conjugated molecule. The ratio of the total mass of chalcogen atoms to the molecular weight of the π-electron conjugated molecule (HTP: 464.64) is 40% or more (in particular, 41.4%).

A synthesis example of hexathiopentacene (HTP) represented by structural formula (3'), single crystal structure analysis, and experimental fabrication of a thin-film transistor (TFT) for evaluation of physical properties will be described below.

[Synthesis of Hexathiopentacene (HTP)]

First, 2 g of pentacene and 2 g of sulfur were pulverized in a mortar, and 250 ml of 1,2,4-trichlorobenzene was added thereto, followed by refluxing under heating in an argon atmosphere for four hours. The resulting crystals were separated by filtration, and purification by sublimation was conducted twice under a vacuum of $10^{-5}$ Pa at 400° C. The resulting hexathiopentacene (HTP) single crystal was subjected to crystal structure analysis.

[Single Crystal Structure Analysis of Hexathiopentacene (HTP)]

Crystal structure analysis was carried out using a Bruker APEX SMART single-crystal diffractometer. Table 1 below shows the crystallographic data obtained.

TABLE 1

| Crystallographic data of hexathiopentacene (HTP) | |
|---|---|
| Molecular formula | $C_{22}H_8S_6$ |
| Molecular weight | 464.64 |
| Measured temperature | 100 K |
| X-ray wavelength used | 0.71073 [Å] |
| Crystal system | Triclinic system |
| Space group | P-1 |
| Lattice constants of unit cell | a-axis = 14.3371(18) [Å] |
| | α = 91.477(2)° |
| | b-axis = 16.564(2) [Å] |
| | β = 97.320(2)° |
| | c-axis = 3.8512(5) [Å] |
| | γ = 72.137(2)° |
| Volume | 863.29(19) [Å³] |
| Z | 2 |
| Density (by calculation) | 1.787 g/cm³ |

Figure 1A:
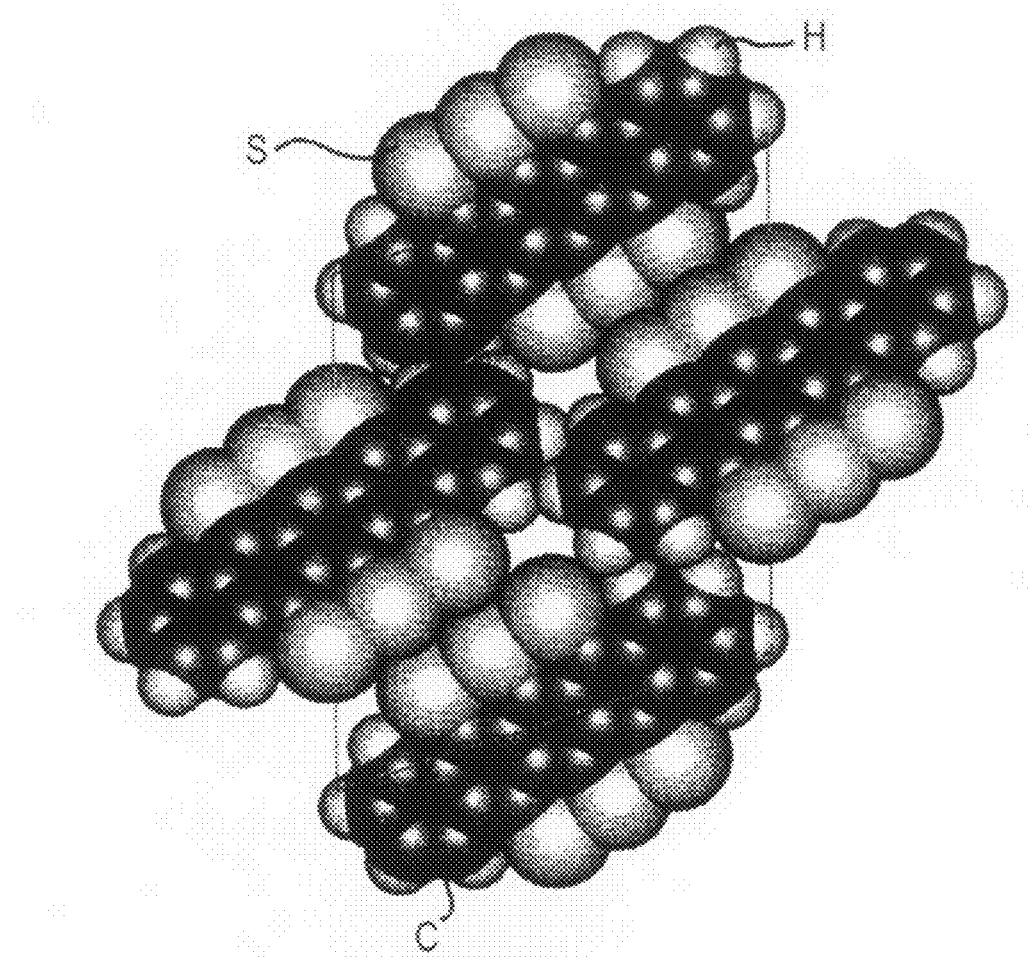
FIG. 1A is a c-axis projection showing the crystal structure of hexathiopentacene (HTP)
Figure 1B:
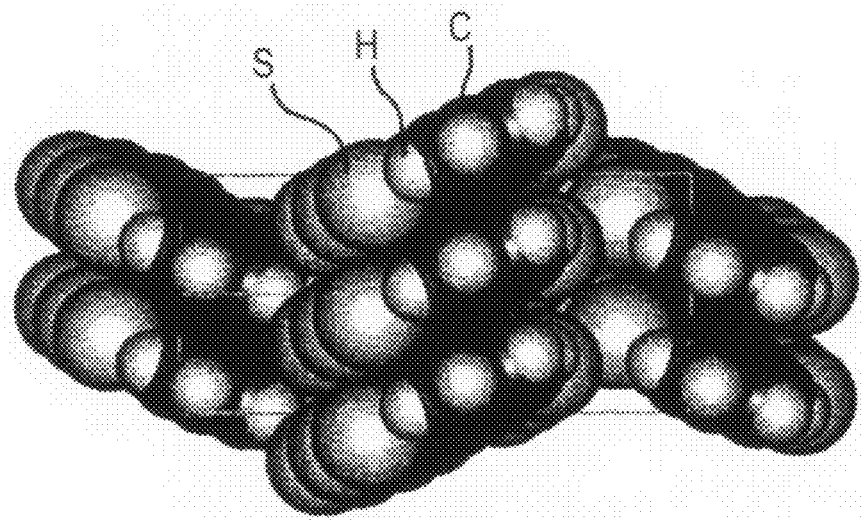
FIG. 1B is an a-axis projection showing the crystal structure of hexathiopentacene (HTP)

FIGS. 1A and 1B show the crystal structure of hexathiopentacene. FIG. 1A is a c-axis projection in which the direction perpendicular to the sheet surface corresponds to the c-axis, and the vertical direction in the drawing corresponds to the a-axis. FIG. 1B is an a-axis projection in which the direction perpendicular to the sheet surface corresponds to the a-axis, and the vertical direction in the drawing corresponds to the c-axis. The crystal structure analysis shows that the hexathiopentacene molecules are stacked in the c-axis direction, and the strongest intermolecular interaction is likely to exist along the c-axis. Furthermore, interactions through the sulfur atoms on the outer peripheries are likely to occur in the [10-1] direction. That is, a quasi-two-dimensional conduction band parallel to the (110) plane is expected.

[Experimental Fabrication of Thin-Film Transistor (TFT) for Evaluation of Physical Properties]

Figure 2:
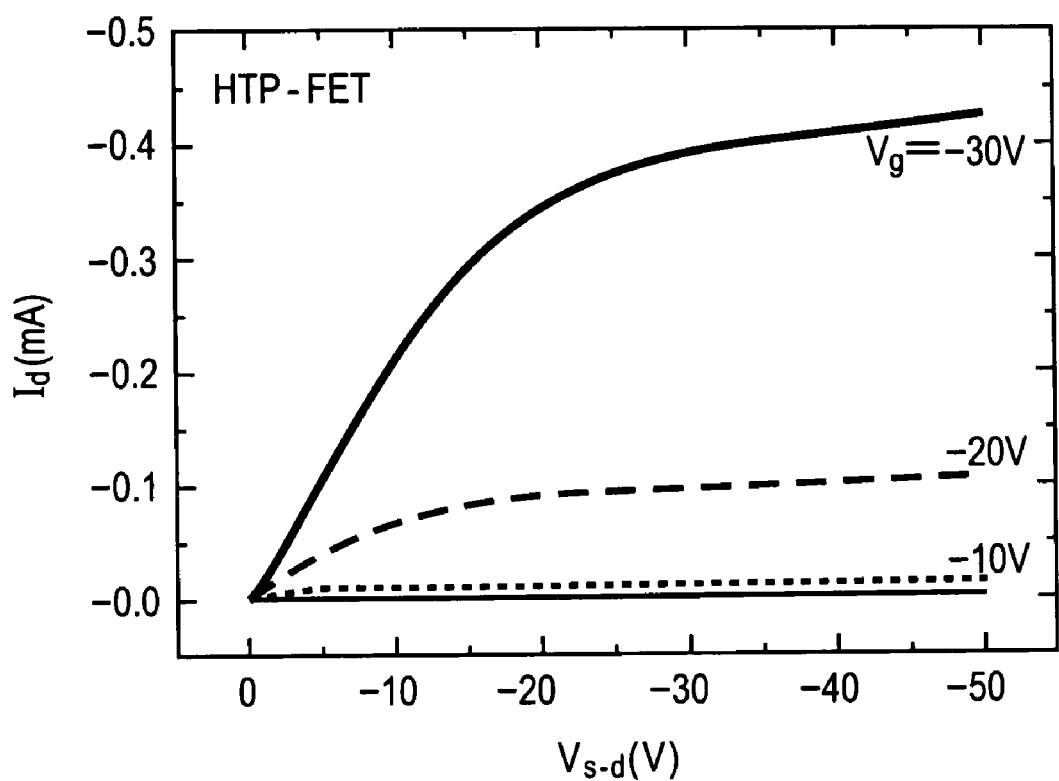
FIG. 2 is a graph showing measurement results of electrical characteristics of a thin-film transistor including a channel-forming region composed of hexathiopentacene obtained in Example 1.

Using the hexathiopentacene thus obtained, a field-effect transistor (FET) including a thin-film transistor (TFT) was experimentally fabricated. Specifically, a gold electrode was disposed on the rear face of a highly doped silicon substrate to form a gate electrode. The front surface of the highly doped silicon substrate was subjected to thermal oxidation to form a gate insulating layer composed of $SiO_2$ with a thickness of 100 nm. Comb-shaped source/drain electrodes were disposed on the gate insulating layer, and then hexathiopentacene was vapor-deposited over the gate insulating layer and the source/drain electrodes. The electrical characteristics of the TFT thus fabricated were measured, and FIG. 2 shows the measurement results ($V_d$-$I_d$ characteristics with $V_g$ as a parameter). As is evident from FIG. 2, satisfactory transistor characteristics were observed, and the mobility was $1.3 \times 10^{-1}$ cm²/Vs. The electrical resistance ρ of the highly doped silicon substrate was about 1×10$^{-2}$ Ω·cm. The thickness of the gate insulating layer was 100 nm, the gate width was 2,400 μm, and the gate length was 100 μm.

Example 2

Example 2 also relates to an organic compound crystal according to the embodiment of the present invention and a FET according to the first embodiment of the present invention, and further relates to a FET according to the twelfth embodiment of the present invention.

The organic compound crystal in Example 2 is composed of bis(methylenedithio)tetrathiafulvalene (BMDT-TTF) corresponding to a π-electron conjugated molecule represented by structural formula (11') below which contains chalcogen atoms, i.e., sulfur (S), as a constituent.

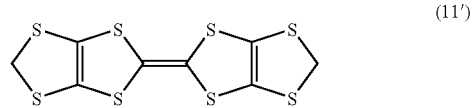
(11')

The FET in Example 2 has the same structure as that shown in FIG. 3A which is a schematic partial sectional view.

In Example 2, the distance between chalcogen atoms (sulfur, S) of a π-electron conjugated molecule (BMDT-TTF) and chalcogen atoms (sulfur, S) of its adjacent π-electron conjugated molecule (BMDT-TTF) is short. That is, chalcogen atoms of a π-electron conjugated molecule and chalcogen atoms of its adjacent π-electron conjugated molecule are linked to each other. In other words, chalcogen atoms of a π-electron conjugated molecule and the chalcogen atoms of its adjacent π-electron conjugated molecule have interactions among each other. The organic compound crystal has a periodic structure in which π-electron conjugated molecules are two-dimensionally linked together (namely, a two-dimensional network structure is formed).

Specifically, sulfur (S), which is the chalcogen atom in Example 2, has the van der Waals' radius ($r_1=r_2$) of 1.80 Å as described in Example 1. Among chalcogen atoms ($X_i$) in a π-electron conjugated molecule and chalcogen atoms ($X_j$) in its adjacent π-electron conjugated molecule, the distance $R_{ij}$ between at least one pair of chalcogen atoms ($X_i$, $X_j$) satisfies the relationship $R_{ij} \leq (r_1+r_2) \times 1.1 = 3.96$ Å. The $R_{ij}$ value is, for example, 3.56 Å or 3.60 Å. Furthermore, sulfur (S), i.e., the chalcogen atom, is contained in the π-electron conjugated system, conjugated with the π-electron conjugated system, participating in the π-electron conjugated system, or taken up by the π-electron conjugated system. Furthermore, in each π-electron conjugated molecule, sulfur (S), i.e., the chalcogen atom, is placed on the outer periphery of the π-electron conjugated molecule. The ratio of the total mass of chalcogen atoms to the molecular weight of the π-electron conjugated molecule (BMDT-TTF: 356.59) is 40% or more (in particular, 71.9%).

A synthesis example of BMDT-TTF represented by structural formula (11'), single crystal structure analysis, and experimental fabrication of a thin-film transistor (TFT) for evaluation of physical properties will be described below.

[Synthesis of BMDT-TTF]

Figure 4:
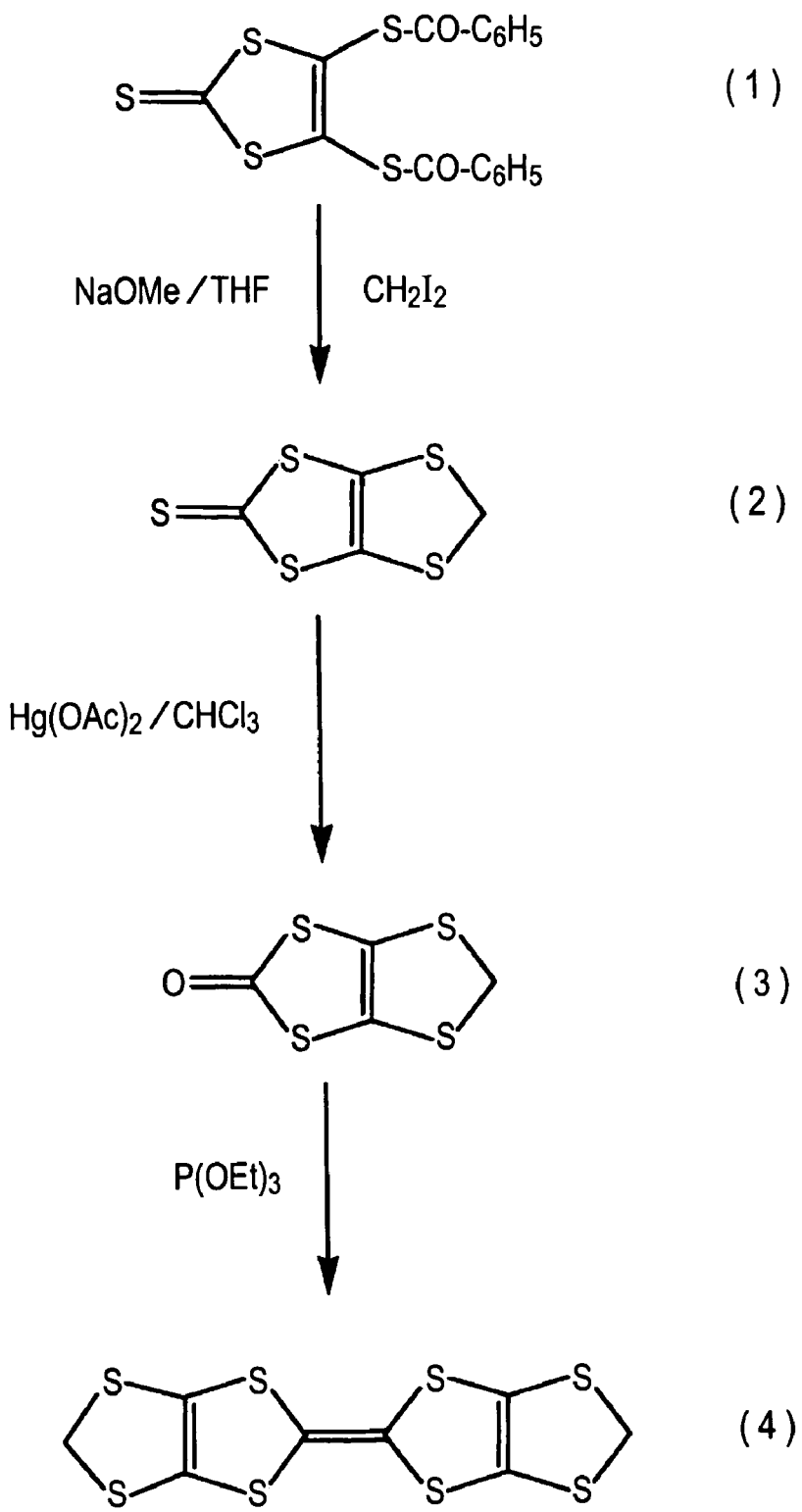
FIG. 4 is a diagram showing Scheme 1 in a method for synthesizing BMDT-TTF in Example 2.

Synthesis was carried out according to Scheme 1 shown in FIG. 4. A compound (3), i.e., 4,5-bis(benzoylthio)-1,3-dithiol-2-one, was synthesized with reference to R. Schultz et al., J. Am. Chem. Soc. 105, 4519 (1983). The compound (3) in an amount of 1.95 g was heated together with 12 ml of P(OEt)$_3$ in an argon atmosphere at about 110° C. As a result, dark red crystals were precipitated. The precipitate was separated by filtration, washed with ethanol, and dried in vacuum. Thereby, 0.80 g of BMDT-TTF was obtained. By recrystallization from CS$_2$, a several millimeter-square thin-film single crystal was precipitated. With respect to BMDT-TTF, crystal structure analysis is reported in R. Kato et al., Chem. Lett. 1231 (1985). However, in order enhance the accuracy of data, the resulting BMDT-TTF single crystal was subjected to crystal structure analysis.

[Single Crystal Structure Analysis of BMDT-TTF]

Crystal structure analysis was carried out using the same single-crystal structure analyzer as that used in Example 1. Table 2 below shows the crystallographic data obtained.

TABLE 2

| Crystallographic data of BMDT-TTF | |
|---|---|
| Molecular formula | $C_8H_4S_8$ |
| Molecular weight | 356.59 |
| Measured temperature | 90 K |
| X-ray wavelength used | 0.71073 [Å] |
| Crystal system | monoclinic system |
| Space group | $P2_1/n$ |
| Lattice constants of unit cell | a-axis = 4.0972(5) [Å] |
| | α = 90° |
| | b-axis = 24.233(3) [Å] |
| | β = 105.060(2)° |
| | c-axis = 6.2676(8) [Å] |
| | γ = 90° |
| Volume | 600.91(13) [Å$^3$] |
| Z | 2 |
| Density (by calculation) | 1.971 g/cm$^3$ |

Figure 5A:
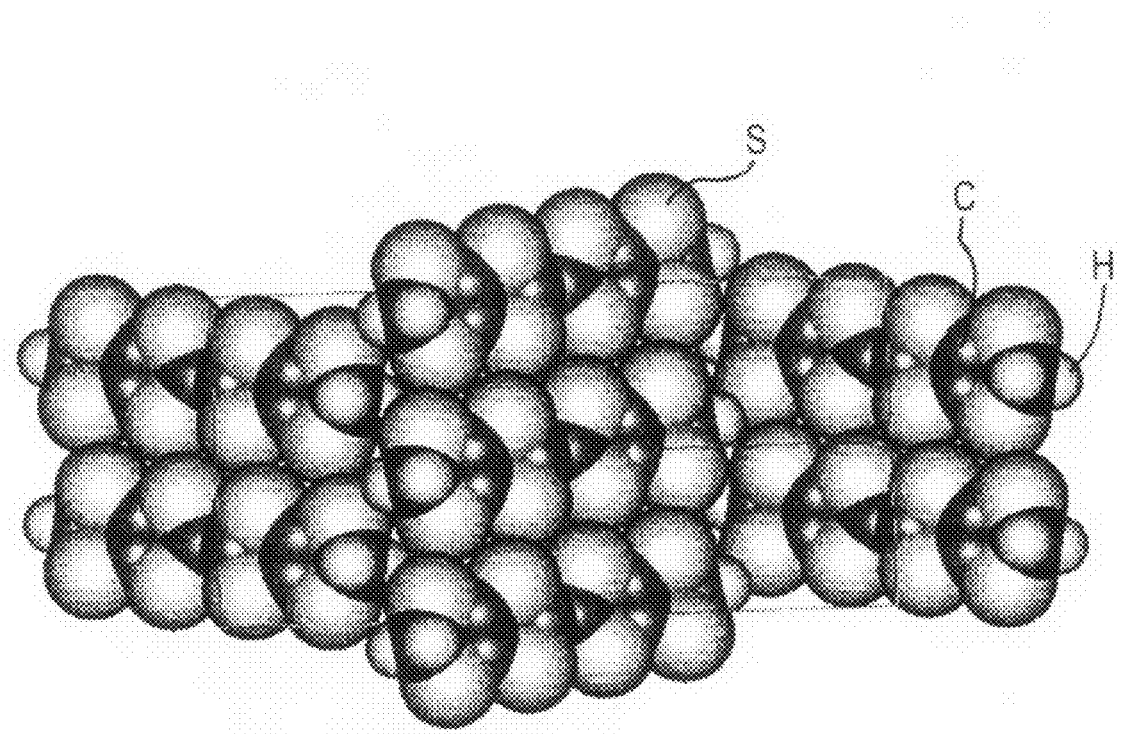
FIG. 5A is an a-axis projection showing the crystal structure of BMDT-TTF obtained in Example 2.
Figure 5B:
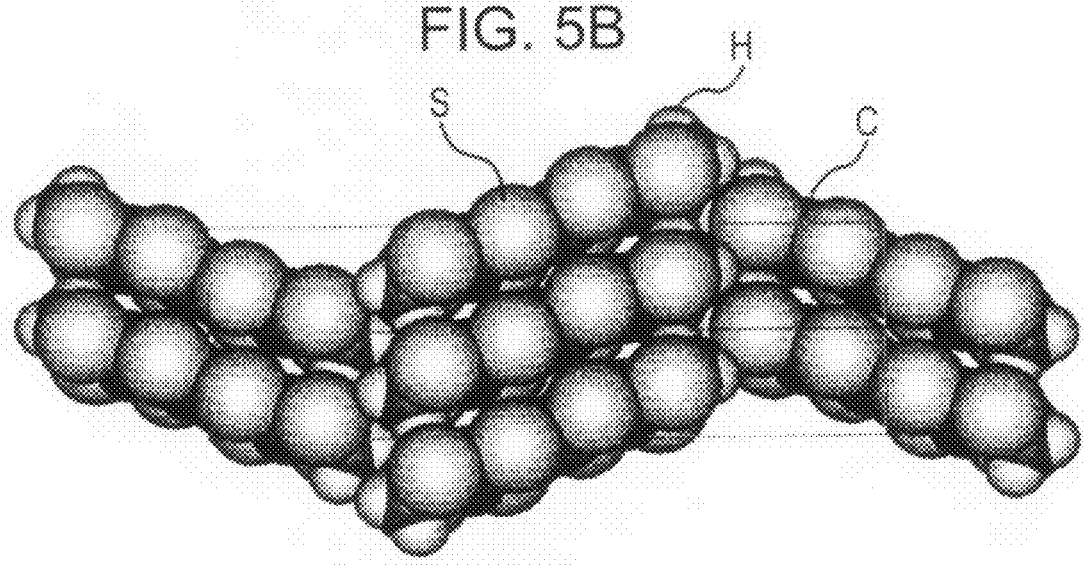
FIG. 5B is a c-axis projection showing the crystal structure of BMDT-TTF obtained in Example 2.

FIGS. 5A and 5B show the crystal structure of BMDT-TTF. FIG. 5A is an a-axis projection in which the direction perpendicular to the sheet surface corresponds to the a-axis, and the vertical direction in the drawing corresponds to the c-axis. FIG. 5B is a c-axis projection in which the direction perpendicular to the sheet surface corresponds to the c-axis, and the vertical direction in the drawing corresponds to the a-axis. The crystal structure analysis shows that the BMDT-TTF molecules are stacked in the a-axis direction, and the strongest intermolecular interaction is likely to exist along the a-axis. Furthermore, interactions through the sulfur atoms on the outer peripheries are likely to occur along the c-axis. That is, a quasi-two-dimensional conduction band parallel to the (010) plane is expected. In order to perform quantitative evaluation, band analysis was carried out using ab-initio calculations.

[Band Analysis of BMDT-TTF]

Band analysis was carried out using an ab-initio calculation program, VASP (Vienna Ab-initio Simulation Package) (refer to G. Kresse and J. Furthmuller, Vienna Ab-initio Simulation Package, which is available from the website). Calculations were carried out using a density functional theory (DFT) method based on generalized gradient approximation (GGA). With respect to the lattice constants of the crystal and the coordinates of the individual atoms, the results of crystal structure analysis described above were used. The cut-off energy was set at 350 eV, and a self-consistent calculation was performed using a k-point mesh of 8×4×4. The results of band analysis are shown in FIG. 6.

Figure 6:
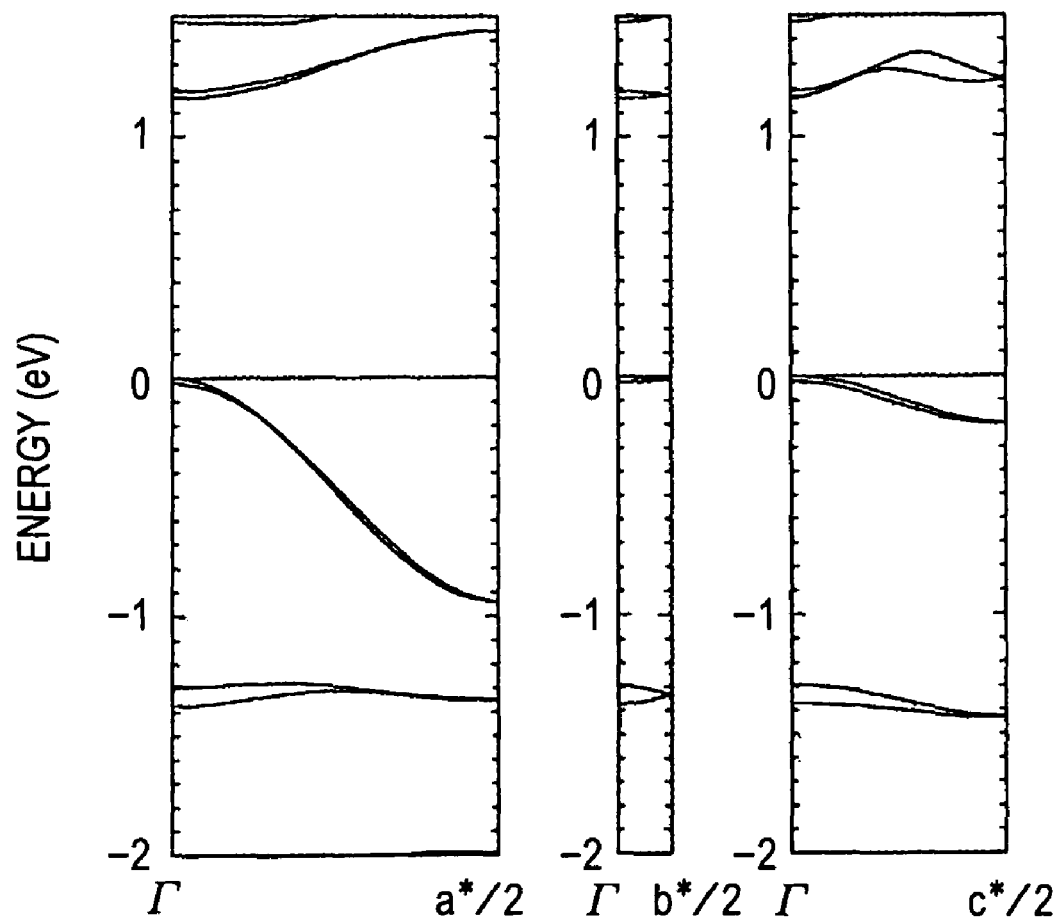
FIG. 6 is a diagram showing results of band analysis of BMDT-TTF obtained in Example 2.

As is evident from FIG. 6, with respect to the conduction band including the highest occupied molecular orbit (HOMO) in the BMDT-TTF crystal, the interaction along the a-axis, which is the axis along which molecules are stacked, is strongest, with a dispersion of about 1 eV in terms of bandwidth. Furthermore, due to interactions of sulfur atoms placed parallel to the molecular plane, a dispersion of about 0.2 eV is also shown along the c-axis. The equi-energy cross section around the Γ point, which is the top of the HOMO band, clearly suggests the presence of a quasi-two-dimensional surface. Furthermore, as a result of evaluation of the effective mass m* along the a-axis in the conduction band of the BMDT-TTF crystal, m*=1.0 $m_e$. Here, $m_e$ is the free electron mass. Consequently, the organic compound crystals composed of BMDT-TTF have inherent properties as a material for p-type channels superior to pentacene (effective mass: about 1.8 $m_e$).

[Experimental Fabrication of Thin-Film Transistor (TFT) for Evaluation of Physical Properties]

Figure 7:
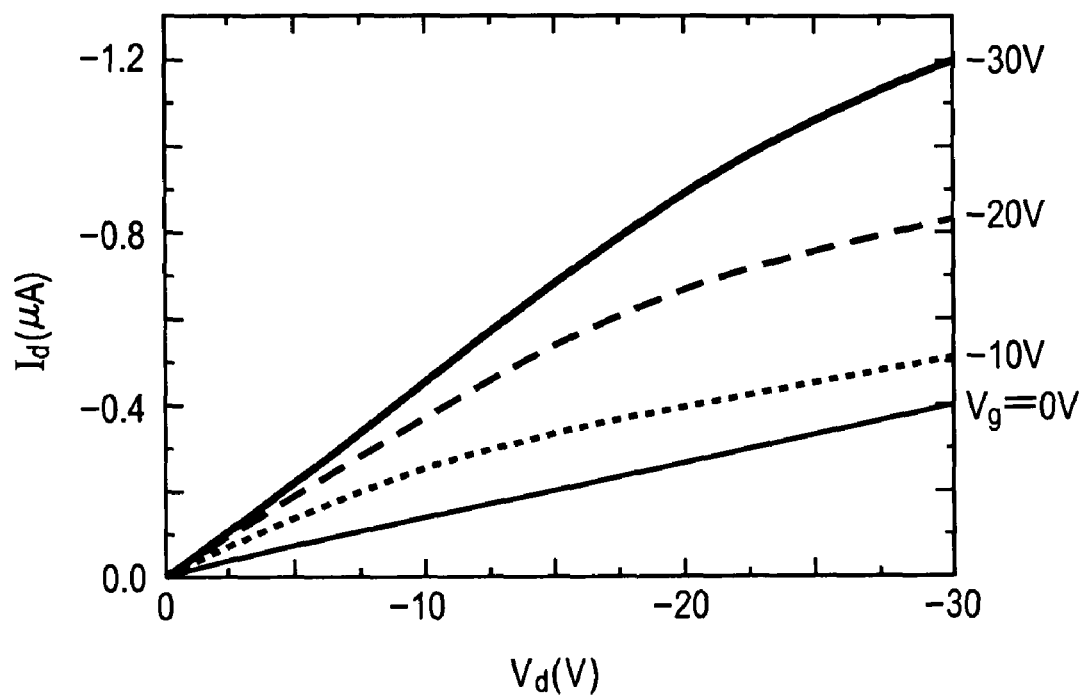
FIG. 7 is a graph showing measurement results of electrical characteristics of a thin-film transistor including a channel-forming region composed of BMDT-TTF obtained in Example 2.

Using the BMDT-TTF thus obtained, a field-effect transistor (FET) including a thin-film transistor (TFT) was experimentally fabricated. Specifically, a gold electrode was disposed on the rear face of a highly doped silicon substrate to form a gate electrode. The front surface of the highly doped silicon substrate was subjected to thermal oxidation to form a gate insulating layer composed of $SiO_2$ with a thickness of 100 nm. Comb-shaped source/drain electrodes were disposed on the gate insulating layer. The silicon substrate was dipped in a BMDT-TTF-saturated carbon disulfide solution, recovered from the solution, and naturally dried. Thereby, BMDT-TTF crystals were precipitated over the gate insulating layer and the source/drain electrodes. The electrical characteristics of the bottom gate/bottom contact type TFT thus fabricated were measured, and FIG. 7 shows the measurement results ($V_d$-$I_d$ characteristics with $V_g$ as a parameter). As is evident from FIG. 7, it has been confirmed that BMDT-TTF also acts as a material for constituting the channel-forming region of the FET.

Example 3

Example 3 also relates to an organic compound crystal according to the embodiment of the present invention and a FET according to the first embodiment of the present invention, and further relates to a FET according to the tenth embodiment of the present invention.

The organic compound crystal in Example 3 is composed of benzo[1,2-c; 3,4-c'; 5,6-c"]tris[1,2]dithiole-1,4,7-trithione (hereinafter referred to as "$C_9S_9$") corresponding to a π-electron conjugated molecule represented by structural formula (9) below which contains chalcogen atoms, i.e., sulfur (S), as a constituent.

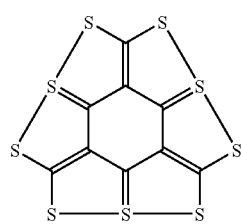

(9)

The FET in Example 3 has the same structure as that shown in FIG. 3A which is a schematic partial sectional view.

In Example 3, the distance between chalcogen atoms (sulfur, S) of a π-electron conjugated molecule ($C_9S_9$) and chalcogen atoms (sulfur, S) of its adjacent π-electron conjugated molecule ($C_9S_9$) is short. That is, chalcogen atoms of a π-electron conjugated molecule and chalcogen atoms of its adjacent π-electron conjugated molecule are linked to each other. In other words, chalcogen atoms of a π-electron conjugated molecule and the chalcogen atoms of its adjacent π-electron conjugated molecule have interactions among each other. The organic compound crystal has a periodic structure in which π-electron conjugated molecules are three-dimensionally linked together (namely, a three-dimensional network structure is formed).

Specifically, sulfur (S), which is the chalcogen atom in Example 3, has the van der Waals' radius ($r_1$=$r_2$) of 1.80 Å as described in Example 1. Among chalcogen atoms ($X_i$) in a π-electron conjugated molecule and chalcogen atoms ($X_j$) in its adjacent π-electron conjugated molecule, the distance $R_{ij}$ between at least one pair of chalcogen atoms ($X_i$, $X_j$) satisfies the relationship $R_{ij} \leq (r_1+r_2) \times 1.1 = 3.96$ Å. The $R_{ij}$ value is, for example, 3.41 Å or 3.58 Å. Furthermore, sulfur (S), i.e., the chalcogen atom, is contained in the π-electron conjugated system, conjugated with the π-electron conjugated system, participating in the π-electron conjugated system, or taken up by the π-electron conjugated system. Furthermore, in each π-electron conjugated molecule, sulfur (S), i.e., the chalcogen atom, is placed on the outer periphery of the π-electron conjugated molecule. The ratio of the total mass of chalcogen atoms to the molecular weight of the π-electron conjugated molecule ($C_9S_9$: 396.64) is 40% or more (in particular, 72.8%).

A synthesis example of $C_9S_9$ represented by structural formula (9), single crystal structure analysis, and experimental fabrication of a thin-film transistor (TFT) for evaluation of physical properties will be described below.

[Synthesis of $C_9S_9$]

Figure 8:
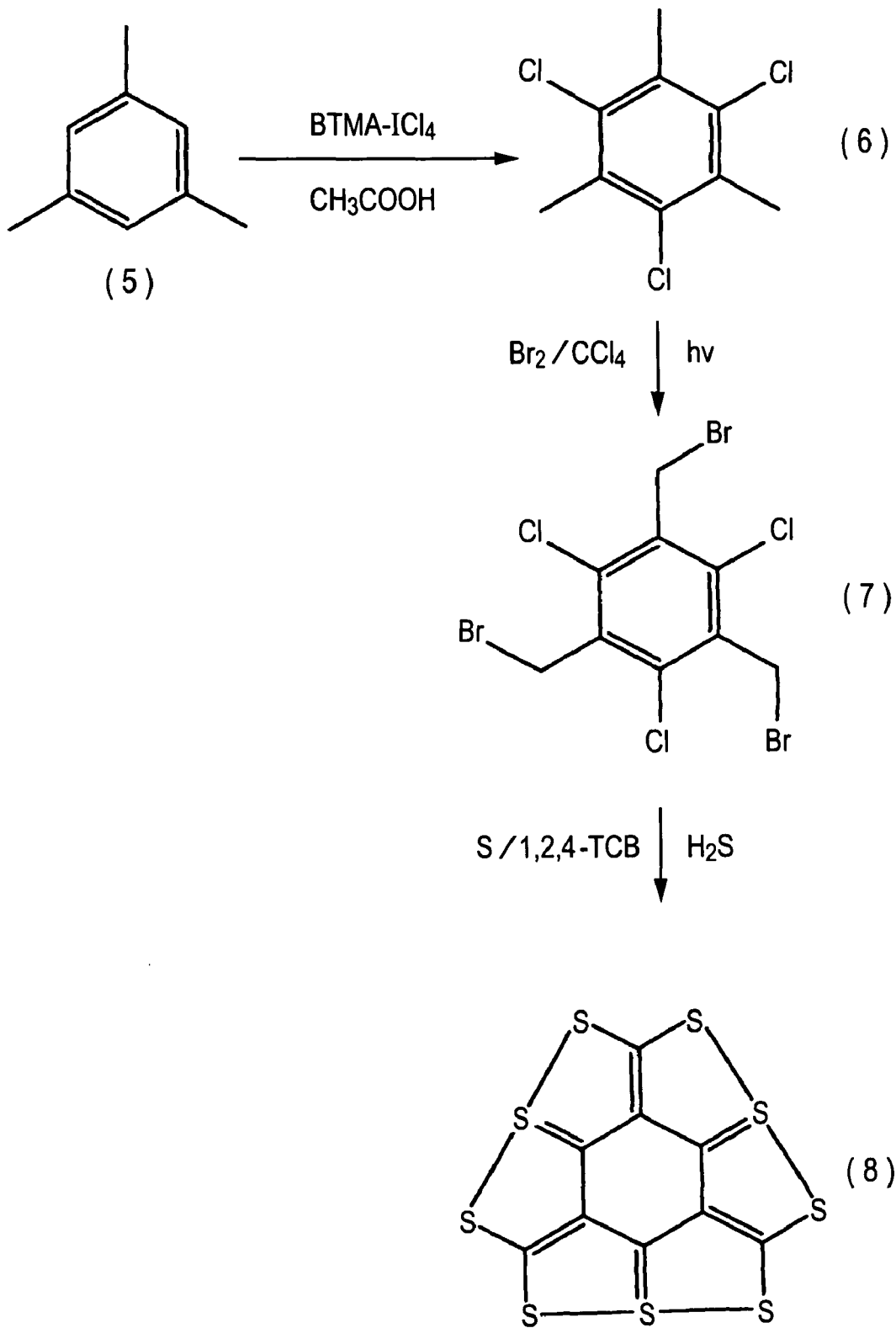
FIG. 8 is a diagram showing Scheme 2 in a method for synthesizing $C_9S_9$ in Example 3.

Synthesis was carried out according to Scheme 2 shown in FIG. 8 with reference to J. P. Brown and T. B. Gay, J. Chem. Soc. Perkin 1,866 (1974).

Specifically, first, trichloromesitylene (6) was synthesized by a method described below. That is, 37.6 g of BTMA-ICl$_4$ was added to 180 ml of an acetic acid solution in which 3.0 g of mesitylene was dissolved, and stirring was continued overnight in an argon atmosphere at 70° C. The mixture was then allowed to stand to cool to room temperature. The resulting precipitated solid was separated by filtration, and 300 ml of hexane was added thereto, followed by filtration. Subsequently, 300 ml of distilled water was added to the filtrate, followed by shaking. After washing with sodium bisulfate and a sodium bicarbonate aqueous solution, drying was performed with magnesium sulfate, followed by concentration. Thereby, 5.05 g of acicular white trichloromesitylene (6) was obtained.

Subsequently, 1,3,5-tribromomethyl-2,4,6-trichlorobenzene (7) was synthesized. That is, 23.3 g of trichloromesitylene (6) was dissolved in 300 ml of carbon tetrachloride, and ultraviolet irradiation was performed under stirring. A solution obtained by diluting 50 g of bromine with 100 ml of carbon tetrachloride was gradually added dropwise to the mixture. Stirring and ultraviolet irradiation were continued for 6 hours, and then the reaction solution was allowed to stand to cool to room temperature. Precipitated crystals were separated by filtration and dissolved in carbon tetrachloride and activated carbon treatment was carried out. Concentration was performed again to produce acicular white crystals. The filtrate was treated with activated carbon and concentration was performed. Thereby, acicular white crystals were produced. By combining the resulting crystals, 42.3 g of 1,3,5-tribromomethyl-2,4,6-trichlorobenzene (7) was obtained.

Subsequently, $C_9S_9$ was synthesized. That is, 2.1 g of 1,3,5-tribromomethyl-2,4,6-trichlorobenzene (7) and 2.1 g of sulfur were pulverized in a mortar, and the pulverized material was added to 130 ml of purified 1,2,4-trichlorobenzene, followed by refluxing under heating in an argon atmosphere, under hydrogen disulfide gas flow, for 6 hours. The resulting solid was purified by sublimation twice under a vacuum of $10^{-5}$ Pa at 360° C. Thereby, 210 mg of $C_9S_9$ (8) as reddish brown crystals was obtained.

[Mass Spectrum of $C_9S_9$]

Figure 9:
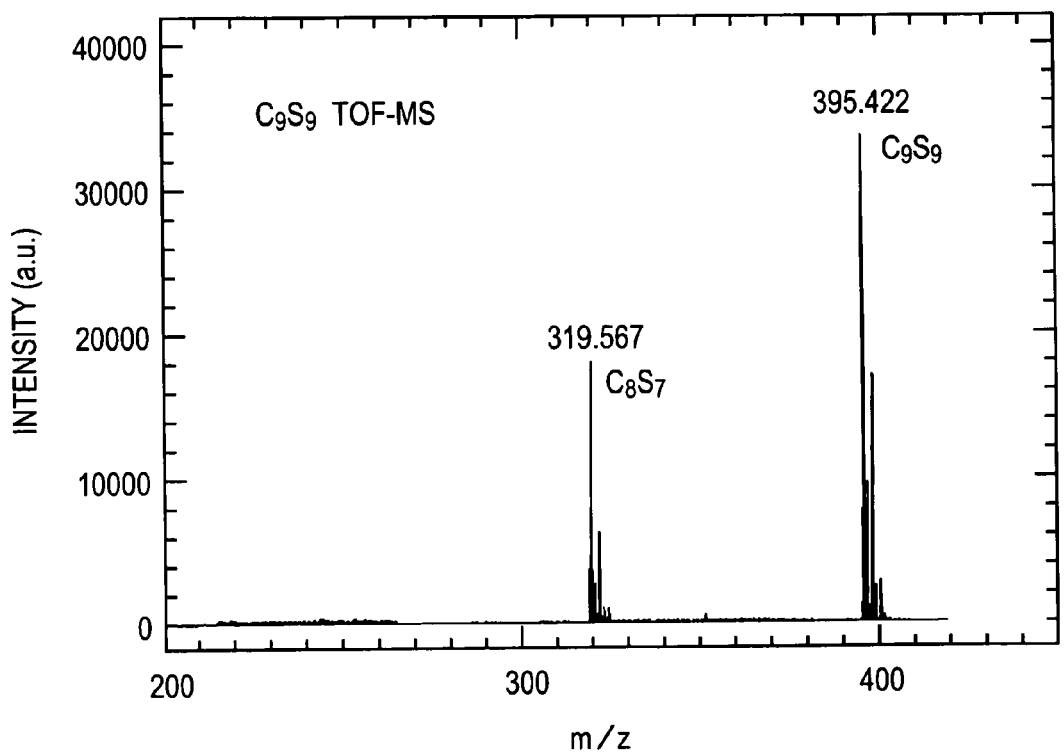
FIG. 9 is a graph showing measurement results of mass spectrum of $C_9S_9$ in Example 3.

In order to check the purity of the synthesized $C_9S_9$, mass spectrum was measured using a time-of-flight mass spectrometer. The measurement was carried out with a Bruker Autoflex mass spectrometer. FIG. 9 shows the measurement results. The peak at m/z=396 corresponds to $C_9S_9$ and the isotopic pattern from m/z=396 to m/z=401 also corresponds to the composition of $C_9S_9$. The peak at m/z=320 corresponds to $C_8S_7$, which was confirmed to be produced by elimination of $CS_2$ from $C_9S_9$, thus being a fragment of the parent molecule. As described above, the synthesized $C_9S_9$ had a very high purity.

[Infrared Absorption Spectrum of $C_9S_9$]

With respect to the synthesized $C_9S_9$, infrared absorption spectrum was measured using a Fourier transform IR spectrometer "Bruker IFS 66 v/S". A specimen was formed into a tablet with KBr. Three strong absorptions were observed at 997 $cm^{-1}$, 1,176 $cm^{-1}$, and 1,472 $cm^{-1}$. Weak absorptions were observed at 492 $cm^{-1}$, 647 $cm^{-1}$, 815 $cm^{-1}$, and 1,342 $cm^{-1}$. All of these bands completely agreed with those predicted by ab-initio calculations based on the structure of $C_9S_9$.

Figure 10A:
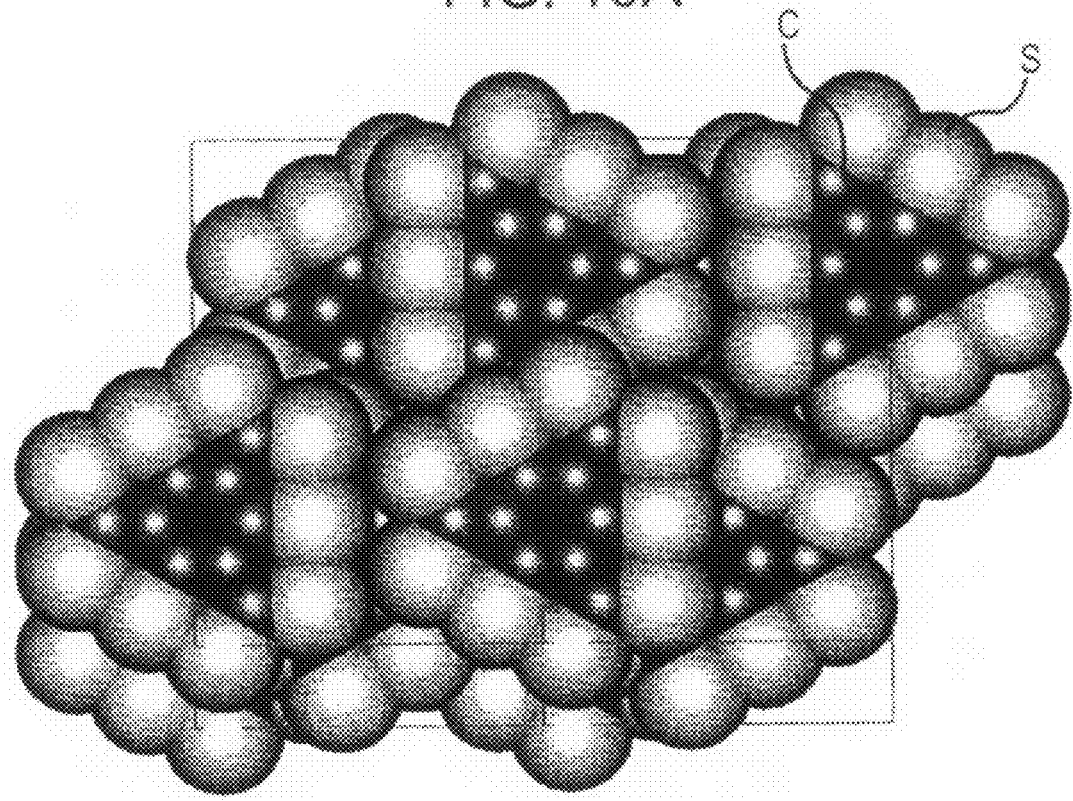
FIG. 10A is a projection normal to the (−202) plane showing the crystal structure of $C_9S_9$ obtained in Example 3.
Figure 10B:
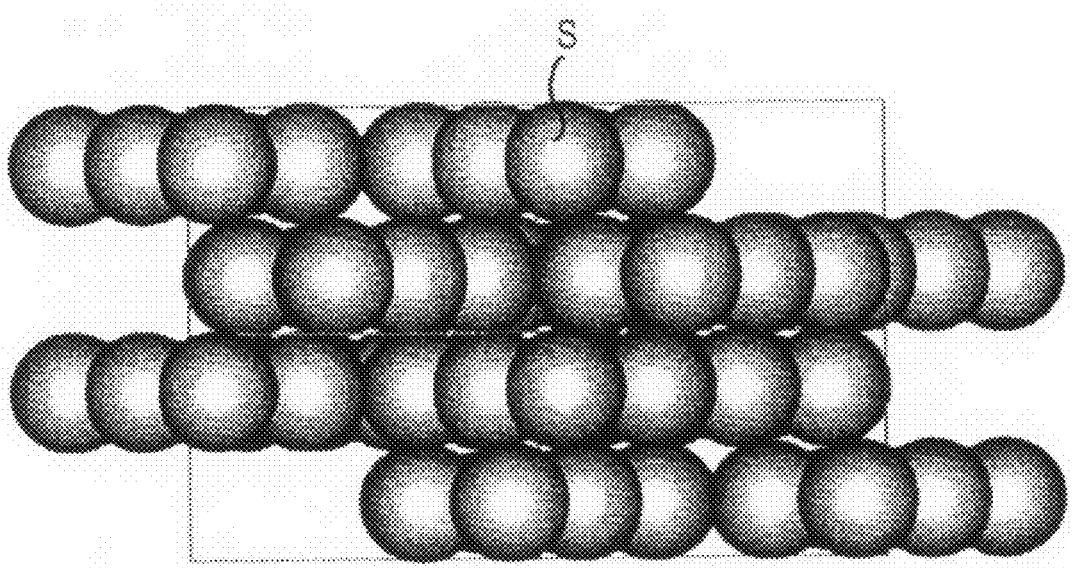
FIG. 10B is a [101] projection showing the crystal structure of $C_9S_9$ obtained in Example 3.

With respect to $C_9S_9$, the crystal structure analyzed by X-ray method has already been reported (refer to L. K. Hansen and A. Hordvik, J. Chem. Soc. Chem. Commun., 800 (1974)). The data in the report will be described in Table 3 below. However, the report does not show data, such as the coordinates of the individual atoms. Consequently, based on the bond length and the bond angle described in the report, coordinates of atoms were set, and furthermore, based on the coordinates, the molecular structure was optimized. Using the lattice constants and space group of the crystal, a molecular arrangement was determined using VASP and MOPAC so that the total energy was minimized in the crystal by packing optimized molecules. FIGS. 10A and 10B show the crystal structure of $C_9S_9$ thus obtained. FIG. 10A is a projection normal to the (−202) plane, and FIG. 10B is a [101] projection. Crystal structure analysis shows that the $C_9S_9$ molecule has a close-packed structure and has a sheet-like structure parallel to the (−202) plane. Furthermore, the molecules are stacked to form a crystal. As described above, since the outer periphery of the $C_9S_9$ molecule is entirely covered with chalcogen atoms, i.e., sulfur (S), very strong interactions are likely to exist both in a direction parallel to the molecular plane and in a direction perpendicular to the molecular plane, and a three-dimensional conduction band is expected. In order to perform quantitative evaluation, band analysis was carried out using ab-initio calculations.

TABLE 3

| Crystallographic data of $C_9S_9$ | |
|---|---|
| Molecular formula | $C_9S_9$ |
| Molecular weight | 396.64 |
| X-ray wavelength used | 0.71073 [Å] |
| Crystal system | monoclinic system |
| Space group | I2/C |
| Lattice constants of unit cell | a-axis = 7.485(4) [Å] |
| | α = 90° |
| | b-axis = 10.096(6) [Å] |

TABLE 3-continued

| Crystallographic data of $C_9S_9$ | |
|---|---|
| | β = 90.87(4)° |
| | c-axis = 15.792(5) [Å] |
| | γ = 90° |
| Volume | 1,193.2 [Å$^3$] |
| Z | 4 |
| Density (by calculation) | 2.21/$cm^3$ |

[Band Analysis of $C_9S_9$]

As in Example 2, band analysis was carried out using the ab-initio calculation program, VASP, and calculations were carried out using a density functional theory (DFT) method based on generalized gradient approximation (GGA). With respect to the lattice constants and the coordinates of the individual atoms, the results of crystal structure analysis described above were used. The cut-off energy was set at 360 eV, and a self-consistent calculation was performed using a k-point mesh of 8×8×8. The results of band analysis are shown in FIG. 11.

Figure 11:
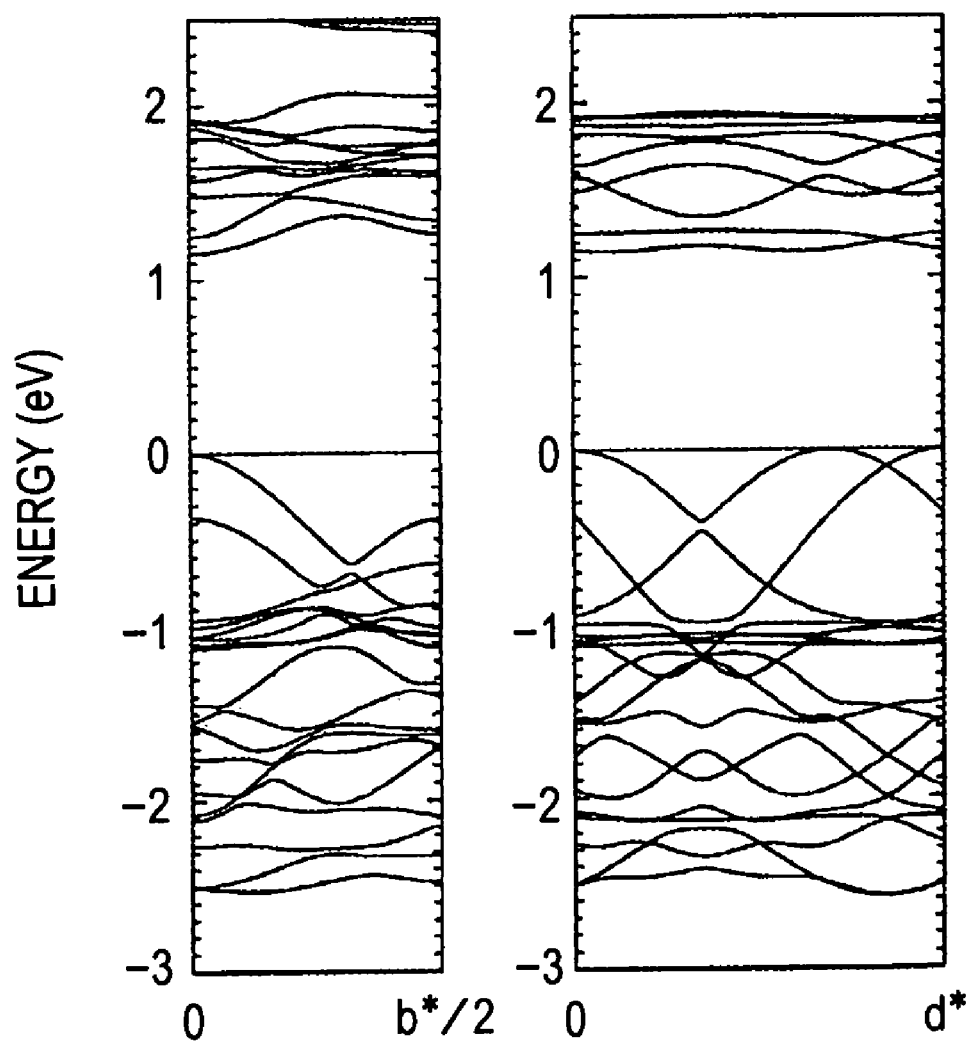
FIG. 11 is a diagram showing results of band analysis of $C_9S_9$ obtained in Example 3.

As is evident from FIG. 11, the conduction band including the highest occupied molecular orbit (HOMO) in the $C_9S_9$ crystal has a very large dispersion both in a direction parallel to the molecular plane (plane including b*) and in a direction perpendicular to the molecular plane (a direction d* in the drawing), with a bandwidth of about 1 eV. What is very characteristic in the $C_9S_9$ crystal is that the equi-energy cross section around the top of the HOMO band has a substantially spherical shape, indicating an isotropic three-dimensional band. The effective mass m*(//b*) in the direction parallel to the molecular plane was 0.68 $m_e$, and the effective mass m*(//d*) in the direction perpendicular to the molecular plane was 0.85 $m_e$. These values shows that the $C_9S_9$ crystal is most isotropic and has the lowest mass among the materials which have been checked by the present inventors. In conclusion, the $C_9S_9$ crystal has a significantly preferable structure as the material constituting the channel-forming region of the FET.

Using the $C_9S_9$ thus obtained, a field-effect transistor (FET) including a thin-film transistor (TFT) was experimentally fabricated, and the electrical characteristics ($V_d$-$I_d$ characteristics with $V_g$ as a parameter) were measured. The results confirms that $C_9S_9$ also acts as a material for constituting the channel-forming region of the FET.

Example 4

Example 4 also relates to an organic compound crystal according to the embodiment of the present invention and a FET according to the first embodiment of the present invention, and further relates to FETs according to the second embodiment, third embodiment, fifth to ninth embodiments, eleventh embodiment, and twelfth embodiment.

The organic compound crystal in Example 4 is composed of a π-electron conjugated molecule, which contains chalcogen atoms, i.e., sulfur (S), as a constituent, represented by structural formula (1') [the second embodiment of the present invention], structural formula (2') [the third embodiment of the present invention], structural formula (4') [the fifth embodiment of the present invention], structural formula (5') [the sixth embodiment of the present invention], structural formula (6') [the seventh embodiment of the present invention], structural formula (7') [the eighth embodiment of the present invention], structural formula (8') [the ninth embodiment of the present invention], structural formula (10) [the eleventh embodiment of the present invention], or general formula (11) [the twelfth embodiment of the present invention, wherein $R_1$, $R_2$, $R_3$, and $R_4$ each represent either a hydrogen atom or an alkyl group having 10 or less carbon atoms] below.

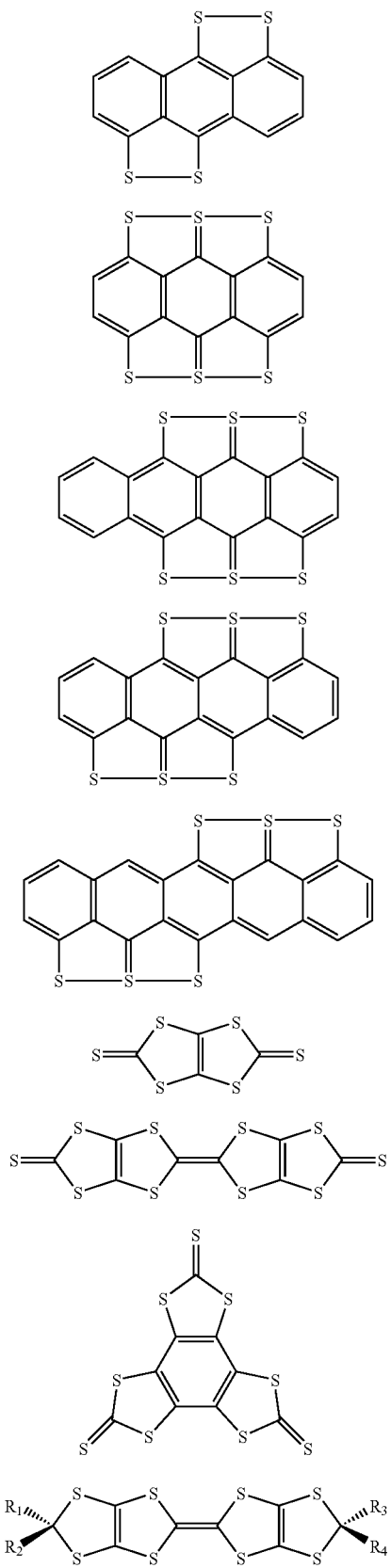

The FET in Example 4 has the same structure as that shown in FIG. 3A which is a schematic partial sectional view.

In Example 4, the distance between chalcogen atoms (sulfur, S) of a π-electron conjugated molecule and chalcogen atoms (sulfur, S) of its adjacent π-electron conjugated molecule is short. That is, chalcogen atoms of a π-electron conjugated molecule and chalcogen atoms of its adjacent π-electron conjugated molecule are linked to each other. In other words, chalcogen atoms of a π-electron conjugated molecule and the chalcogen atoms of its adjacent π-electron conjugated molecule have interactions among each other. The organic compound crystal has a periodic structure in which π-electron conjugated molecules are two-dimensionally linked together (namely, a two-dimensional network structure is formed) [refer to structural formulae (1) to (6) and general formula (11)]. Alternatively, the organic compound crystal has a periodic structure in which π-electron conjugated molecules are three-dimensionally linked together (namely, a three-dimensional network structure is formed) [refer to structural formulae (7) to (10)]. Namely, basically, two-dimensional networks are formed by the structures which contain hydrogen atoms, while three-dimensional networks are formed by the structures which do not contain hydrogen atoms.

Specifically, sulfur (S), which is the chalcogen atom in Example 4, has the van der Waals' radius ($r_1=r_2$) of 1.80 Å as described in Example 1. Among chalcogen atoms ($X_i$) in a π-electron conjugated molecule and chalcogen atoms ($X_j$) in its adjacent π-electron conjugated molecule, the distance $R_{ij}$ between at least one pair of chalcogen atoms ($X_i$, $X_j$) satisfies the relationship $R_{ij} \leq (r_1+r_2) \times 1.1 = 3.96$ Å. Furthermore, sulfur (S), i.e., the chalcogen atom, is contained in the π-electron conjugated system, conjugated with the π-electron conjugated system, participating in the π-electron conjugated system, or taken up by the π-electron conjugated system. Furthermore, in each π-electron conjugated molecule, sulfur (S), i.e., the chalcogen atom, is placed on the outer periphery of the π-electron conjugated molecule. The ratio of the total mass of chalcogen atoms to the molecular weight of the π-electron conjugated molecule is 40% or more.

Synthesis examples of π-electron conjugated molecules represented by structural formulae (1'), (2'), (4'), (5'), (6'), (7'), (8'), and (10), and general formula (11) will be described below.

[Synthesis of π-Electron Conjugated Molecule Represented by Structural Formula (1')]

Figure 12:
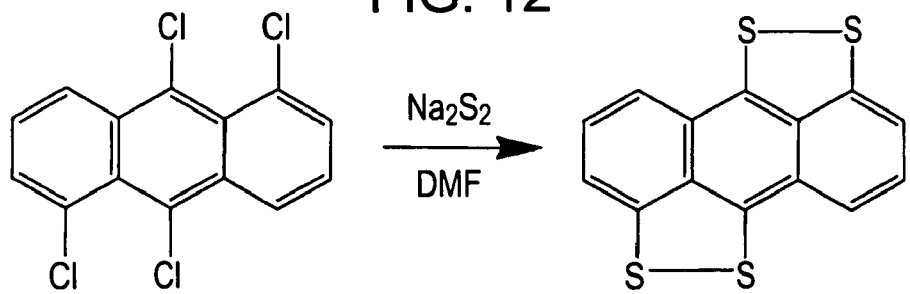
FIG. 12 is a diagram showing a scheme in a method for synthesizing a π-electron conjugated molecule represented by structural formula (1') in Example 4.

The target compound can be synthesized from 1,5,9,10-tetrachloroanthraquinone with reference to H. Endres et al., Mol. Cryst. Liq. Cryst. 86, 111 (1982). A scheme of synthesis is shown in FIG. 12.

[Synthesis of π-Electron Conjugated Molecule Represented by Structural Formula (21)]

Figure 13:
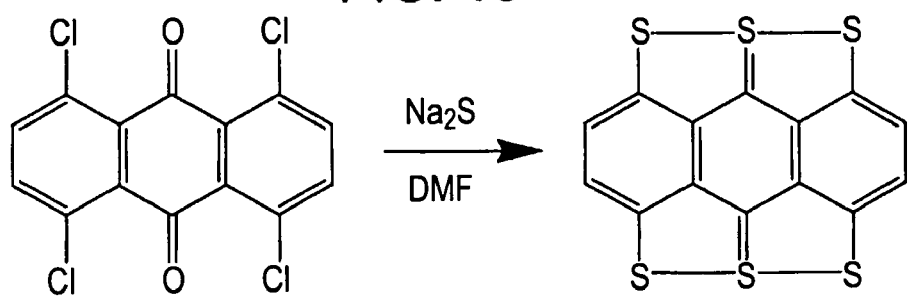
FIG. 13 is a diagram showing a scheme in a method for synthesizing a π-electron conjugated molecule represented by structural formula (2') in Example 4.

The target compound can be synthesized from 1,4,5,8-tetrachloro-9,10-anthraquinone with reference to S. Davidson et al., J. Chem. Research (S), 221 (1980). A scheme of synthesis is shown in FIG. 13.

[Synthesis of π-Electron Conjugated Molecule Represented by Structural Formula (4')]

Figure 14:
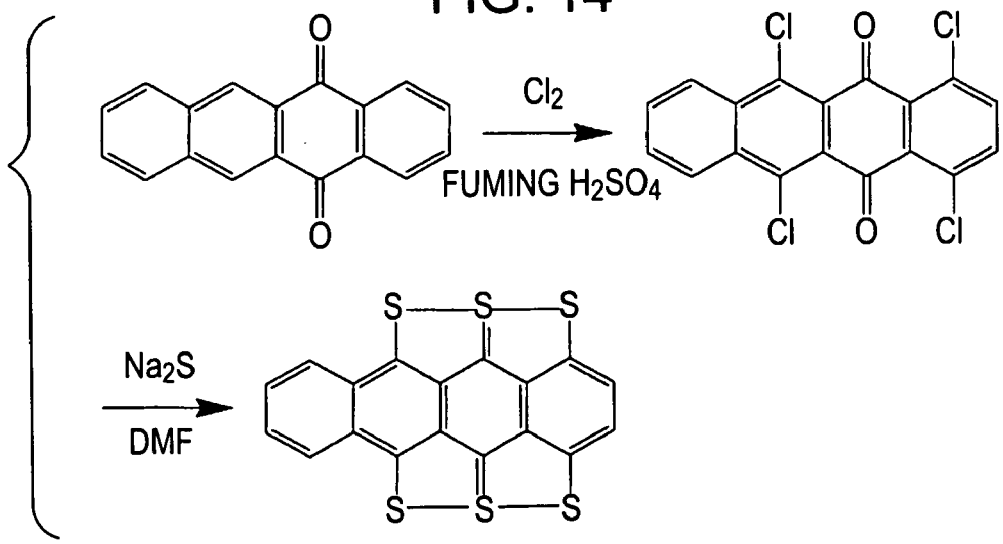
FIG. 14 is a diagram showing a scheme in a method for synthesizing a π-electron conjugated molecule represented by structural formula (4') in Example 4.

5,12-Naphthacenequinone, which is used as a starting material, is chlorinated by chlorine gas in fuming sulfuric acid to yield an intermediate. The intermediate is allowed to react with sodium sulfide by the same method as that used for synthesis of the π-electron conjugated molecule represented by structural formula (21) to yield the target compound. A scheme of synthesis is shown in FIG. 14.

[Synthesis of π-Electron Conjugated Molecule Represented by Structural Formula (5')]

Figure 15:
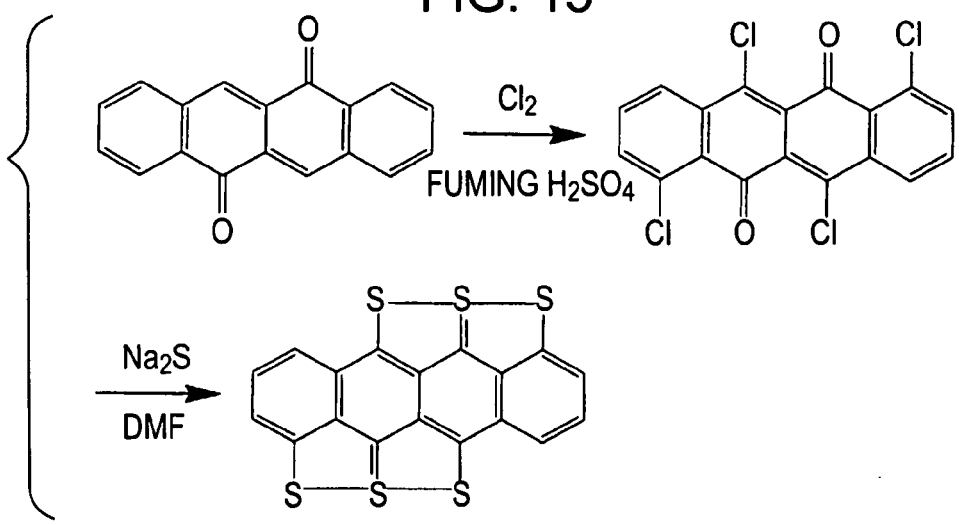
FIG. 15 is a diagram showing a scheme in a method for synthesizing a π-electron conjugated molecule represented by structural formula (5') in Example 4.

5,11-Naphthacenequinone, which is used as a starting material, is chlorinated by chlorine gas in fuming sulfuric acid to yield an intermediate. The intermediate is allowed to react with sodium sulfide by the same method as that used for synthesis of the π-electron conjugated molecule represented by structural formula (2') to yield the target compound. A scheme of synthesis is shown in FIG. 15.

[Synthesis of π-Electron Conjugated Molecule Represented by Structural Formula (6')]

Figure 16:
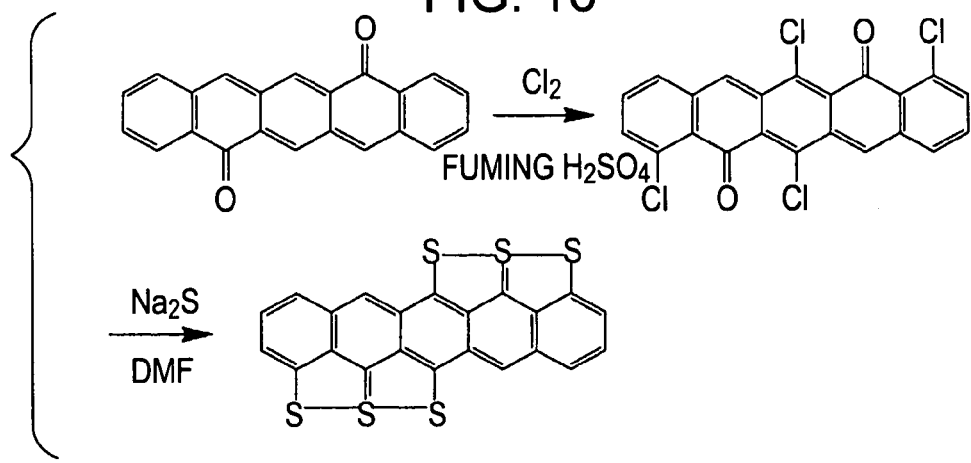
FIG. 16 is a diagram showing a scheme in a method for synthesizing a π-electron conjugated molecule represented by structural formula (6') in Example 4.
Figure 17:
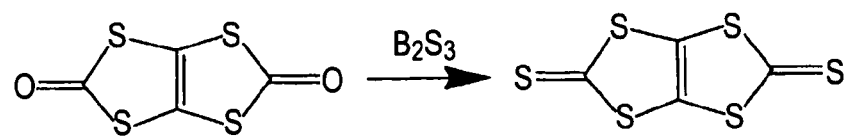
FIG. 17 is a diagram showing a scheme in a method for synthesizing a π-electron conjugated molecule represented by structural formula (7') in Example 4.

5,12-Pentacenequinone, which is used as a starting material, is chlorinated by chlorine gas in fuming sulfuric acid to yield an intermediate. The intermediate is allowed to react with sodium sulfide by the same method as that used for synthesis of the π-electron conjugated molecule represented by structural formula (2') to yield the target compound. A scheme of synthesis is shown in FIG. 16. Additionally, 5,12-pentacenequinone can be synthesized with reference to E. Clar, Ber. 73B, 409 (1940).

[Synthesis of π-Electron Conjugated Molecule Represented by Structural Formula (7')]

The target compound can be synthesized from 1, 5, 9, 10-tetrachloroanthraquinone with reference to H. Endres et al., Mol. Cryst. Liq. Cryst. 86, 111 (1982). A scheme of the synthesis is shown in FIG. 12.

[Synthesis of π-Electron Conjugated Molecule Represented by Structural Formula (8')]

Figure 18:
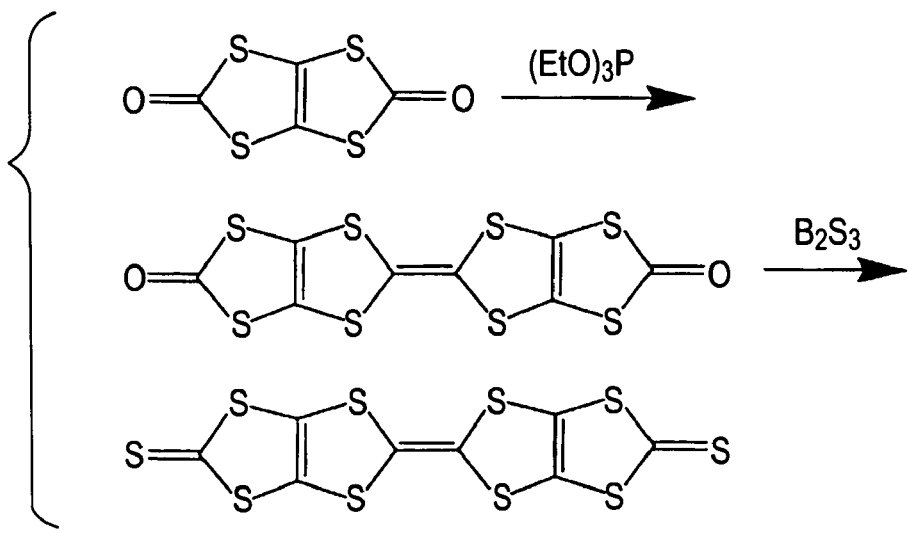
FIG. 18 is a diagram showing a scheme in a method for synthesizing a π-electron conjugated molecule represented by structural formula (8') in Example 4.

The target compound can be synthesized from 1,3,4,6-tetrathiopentalene-2,5-dione with reference to R. R. Schumaker et al., J. Am. Chem. Soc. 99, 5521 (1977). A scheme of synthesis is shown in FIG. 18.

[Synthesis of π-Electron Conjugated Molecule Represented by Structural Formula (10)]

Figure 19:
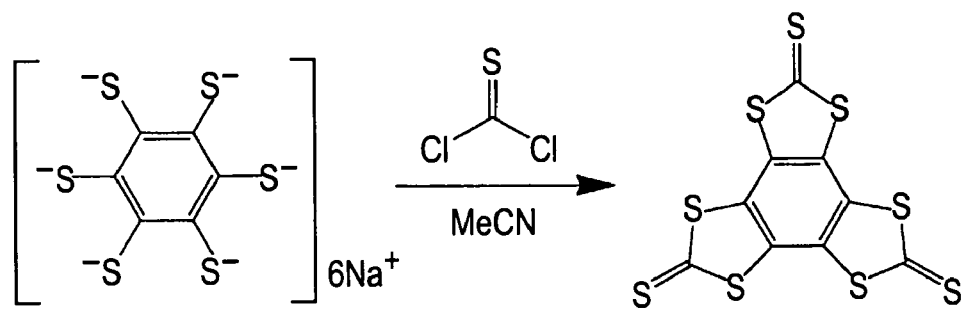
FIG. 19 is a diagram showing a scheme in a method for synthesizing a π-electron conjugated molecule represented by structural formula (10) in Example 4.

The target compound can be synthesized from 1,3,4,6-tetrathiopentalene-2,5-dione with reference to A. M. Richter et al., Synthesis 1149 (1990). A scheme of synthesis is shown in FIG. 19.

[Synthesis of π-Electron Conjugated Molecule Represented by General Formula (11)]

Figure 20:
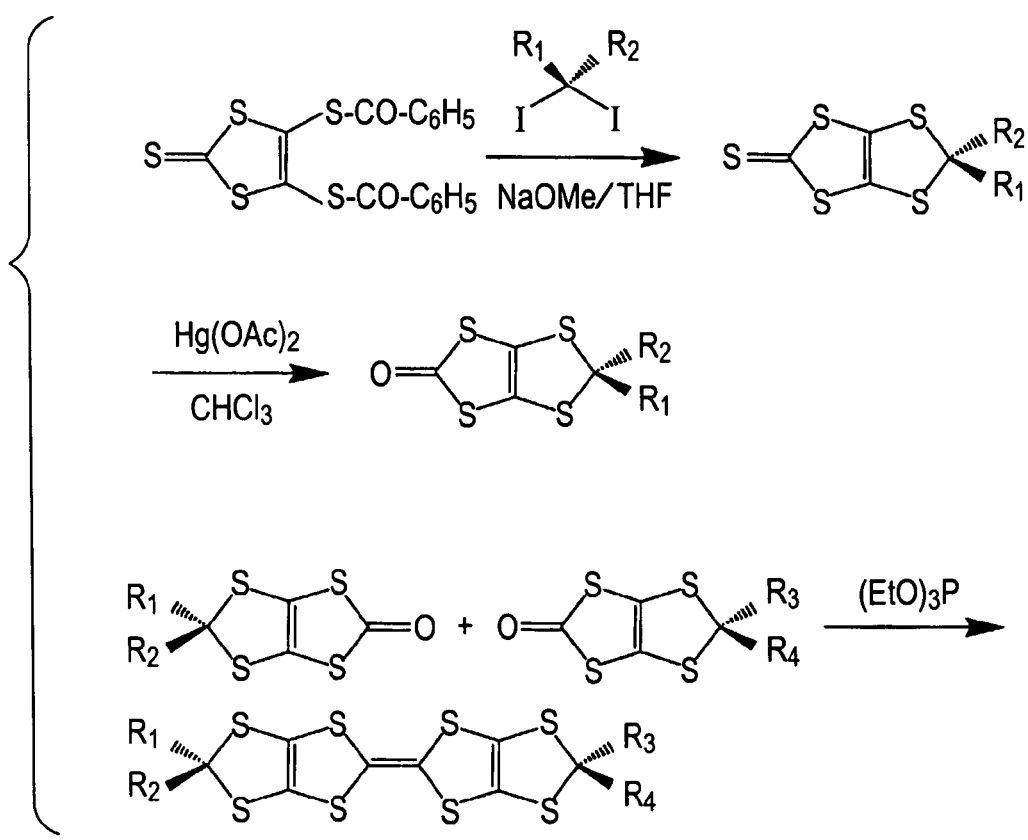
FIG. 20 is a diagram showing a scheme in a method for synthesizing a π-electron conjugated molecule represented by general formula (11) in Example 4.

The target compound can be synthesized as in the scheme of synthesis for BMDT-TTF shown in FIG. 4. That is, by using a diiodohydrocarbon $R_1$—$CI_2$—$R_2$ instead of diiodomethane ($CH_2I_2$), a corresponding thione compound is obtained. By using another diiodohydrocarbon $R_3$—$CI_2$—$R_4$, another thione compound is obtained. After thione compounds are converted into ketones using mercury acetate, the ketones are coupled to synthesize the target compound (11). A scheme of synthesis is shown in FIG. 20.

Using ten types of π-electron conjugated molecules thus obtained, field-effect transistors (FETs) including thin-film transistors (TFTs) having the same structure as that in Example 1 were experimentally fabricated, and the electrical characteristics ($V_d$-$I_d$ characteristics with $V_g$ as a parameter) were measured. The results confirm that any type of π-electron conjugated molecules acts as a material for constituting the channel-forming region of the FET.

The preferred embodiments of the present invention have been described above. However, the present invention is not limited thereto. The methods for synthesis of π-electron conjugated molecules in the examples have been described for illustrative purposes, and can be changed as appropriate. The starting materials in synthesis have also been described for illustrative purposes, and can be changed or selected as appropriate. Consequently, as the chalcogen atom, besides sulfur (S), selenium (Se), tellurium (Te), or the like can be introduced into π-electron conjugated molecules.

Figure 3B:
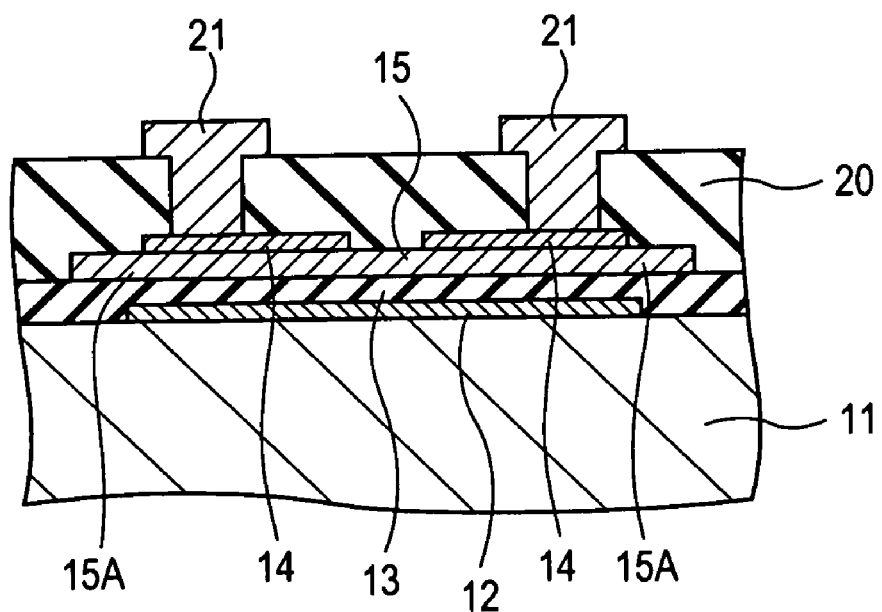
FIG. 3B is a schematic partial sectional view of a bottom gate/top contact type field-effect transistor, which is a variation of field-effect transistor.

Furthermore, the structure of field-effect transistors and the constituent materials have also been described for illustrative purposes, and can be changed as appropriate. As a variation, a FET having the first structure, i.e., bottom gate/top contact type FET, is shown in FIG. 3B which is a schematic partial sectional view. This FET includes (A) a gate electrode 12 disposed on a support 11, (B) a gate-insulating layer 13 disposed on the gate electrode 12, (C) a channel-forming region 15 and a channel-forming region extension 15A disposed on the gate-insulating layer 13, and (D) source/drain electrodes 14 disposed on the channel-forming region extension 15A.

Figure 21A:
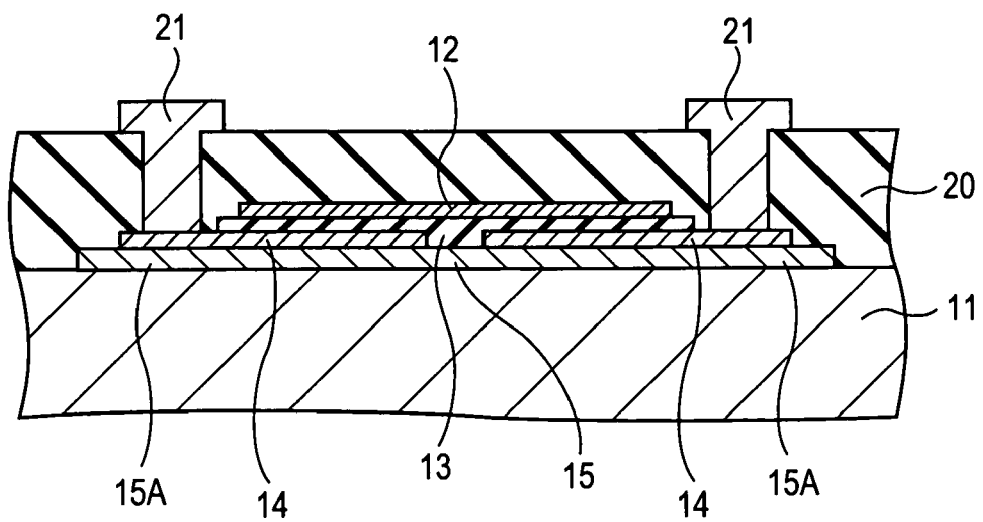
FIG. 21A is a schematic partial sectional view of a top gate/top contact type field-effect transistor, which is another variation of field-effect transistor.

A FET having the second structure, i.e., top gate/top contact type FET, is shown in FIG. 21A which is a schematic partial sectional view. This FET includes (A) a channel-forming region 15 and a channel-forming region extension 15A disposed on a support 11, (B) source/drain electrodes 14 disposed on the channel-forming region extension 15A, (C) a gate-insulating layer 13 disposed on the source/drain electrodes 14 and the channel-forming region 15, and (D) a gate electrode 12 disposed on the gate-insulating layer 12.

Figure 21B:
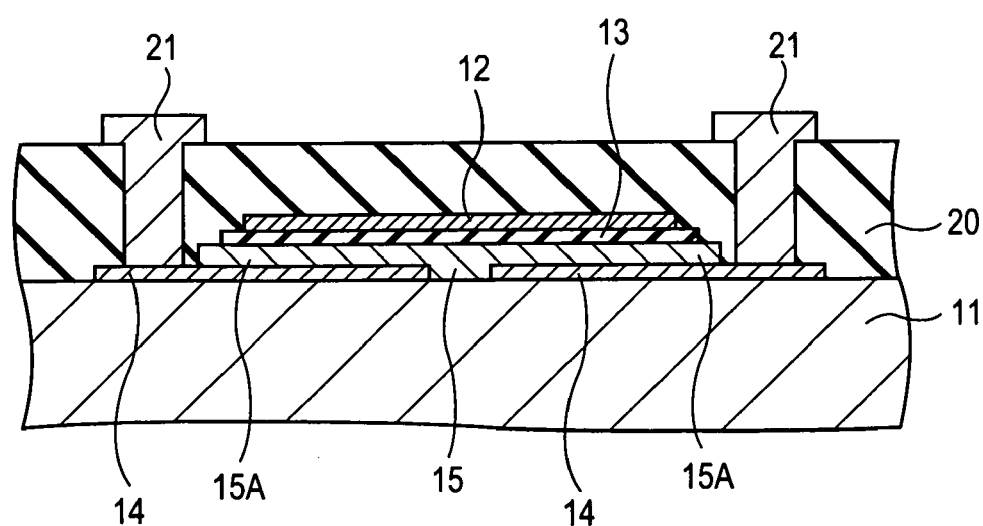
FIG. 21B is a schematic partial sectional view of a top gate/bottom contact type field-effect transistor, which is another variation of field-effect transistor.
Figure 22:
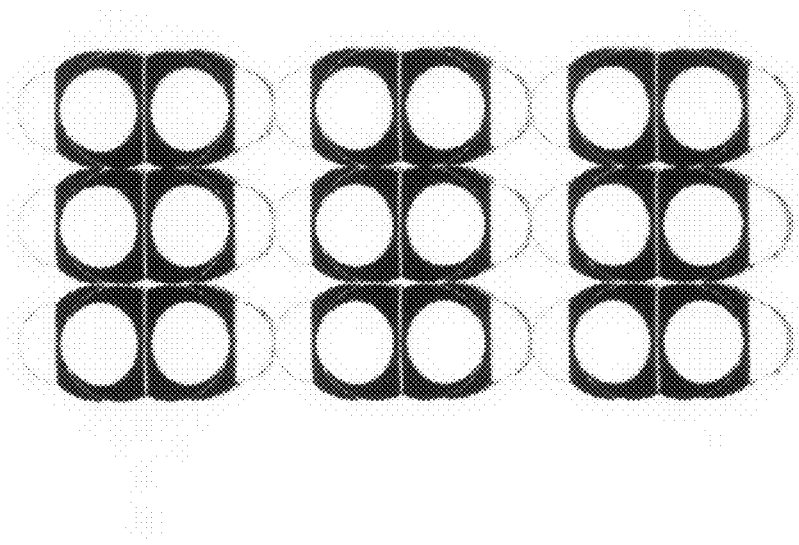
FIG. 22 is a diagram which shows a stack structure of molecules in an organic compound crystal.
Figure 23:
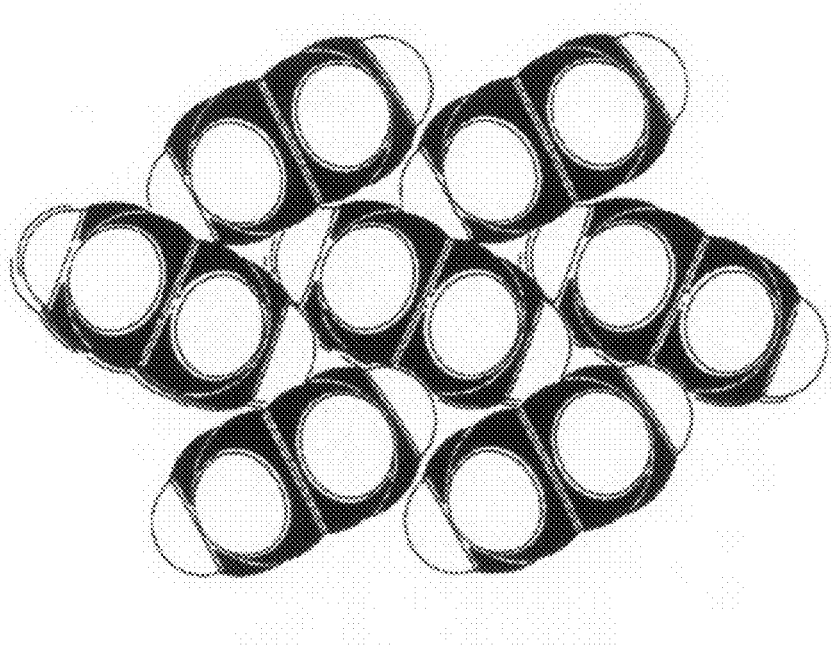
FIG. 23 is a diagram which shows a herringbone structure of molecules in an organic compound crystal.

A FET having the fourth structure, i.e., top gate/bottom contact type FET, is shown in FIG. 21B which is a schematic partial sectional view. This FET includes (A) source/drain electrodes 14 disposed on a support 11, (B) a channel-forming region 15 disposed on the support 11 and a channel-forming region extension 15A disposed on the source/drain electrodes 14, (C) a gate-insulating layer 13 disposed on the channel-forming region 15 and the channel-forming region extension 15A, and (D) a gate electrode 12 disposed on the gate-insulating layer 13.

It should be understood by those skilled in the art that various modifications, combinations, sub-combinations and alterations may occur depending on design requirements and other factors insofar as they are within the scope of the appended claims or the equivalents thereof.

What is claimed is:

1. A field-effect transistor comprising:
a gate electrode, a source electrode, a drain electrode, a channel-forming region between the source electrode and the drain electrode, and a gate insulator between the gate electrode and the channel-forming region;
the channel-forming region includes π-electron conjugated molecules each represented by general formula (2):

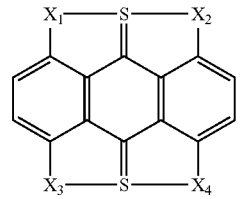

(2)

wherein $X_1$, $X_2$, $X_3$, and $X_4$ each represent any one of an oxygen atom, a sulfur atom, a selenium atom, and a tellurium atom.

* * * * *